(12) United States Patent
Ajayan et al.

(10) Patent No.: US 8,310,134 B2
(45) Date of Patent: Nov. 13, 2012

(54) COMPOSITION FOR ENERGY GENERATOR, STORAGE, AND STRAIN SENSOR AND METHODS OF USE THEREOF

(75) Inventors: Pulickel M. Ajayan, Houston, TX (US); Ashavani Kumar, Honolulu, HI (US); Andres Rafael Botello-Mendez, San Luis Potosi (MX); Hemtej Gullapalli, Houston, TX (US); Mauricio Terrones Maldonado, Colonia Lomas (MX)

(73) Assignee: William Marsh Rice University, Houston, TX (US)

( * ) Notice: Subject to any disclaimer, the term of this patent is extended or adjusted under 35 U.S.C. 154(b) by 225 days.

(21) Appl. No.: 12/692,514

(22) Filed: Jan. 22, 2010

(65) Prior Publication Data

US 2010/0294976 A1 Nov. 25, 2010

Related U.S. Application Data

(60) Provisional application No. 61/146,421, filed on Jan. 22, 2009.

(51) Int. Cl.
*H01L 41/08* (2006.01)

(52) U.S. Cl. .................................... 310/357; 310/800
(58) Field of Classification Search .......... 310/357–359, 310/328, 340, 800
See application file for complete search history.

(56) References Cited

U.S. PATENT DOCUMENTS

| 7,705,523 | B2* | 4/2010 | Wang et al. | 310/339 |
| 7,777,478 | B2* | 8/2010 | Dai et al. | 324/109 |
| 2008/0061656 | A1* | 3/2008 | Kim | 310/330 |
| 2008/0129278 | A1* | 6/2008 | Dai et al. | 324/109 |
| 2009/0309456 | A1* | 12/2009 | Stollberg | 310/319 |
| 2010/0102033 | A1* | 4/2010 | Choi et al. | 216/101 |
| 2011/0006787 | A1* | 1/2011 | Kadono | 324/658 |
| 2011/0023608 | A1* | 2/2011 | Rueger | 73/579 |
| 2011/0098643 | A1* | 4/2011 | Chiang et al. | 604/131 |

* cited by examiner

*Primary Examiner* — Mark Budd
(74) *Attorney, Agent, or Firm* — Winstead PC

(57) ABSTRACT

Compositions and devices for harvesting electrical energy from mechanical and thermal energy, storing such produced energy, and sensing strain based on low cost materials and processes. In embodiments, the compositions are flexible and include a flexible polymer embedded and coated with a nanostructured piezoelectric material.

17 Claims, 23 Drawing Sheets

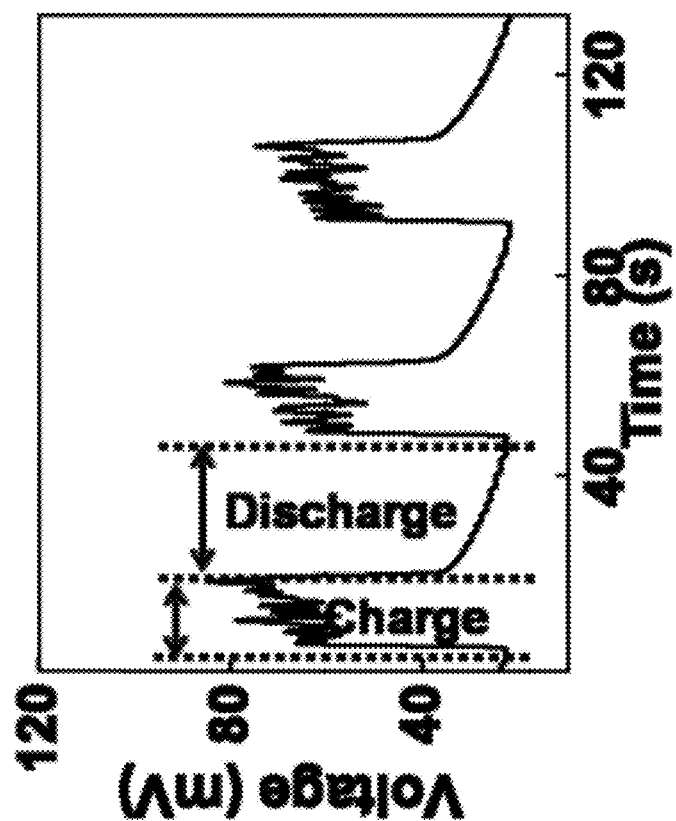
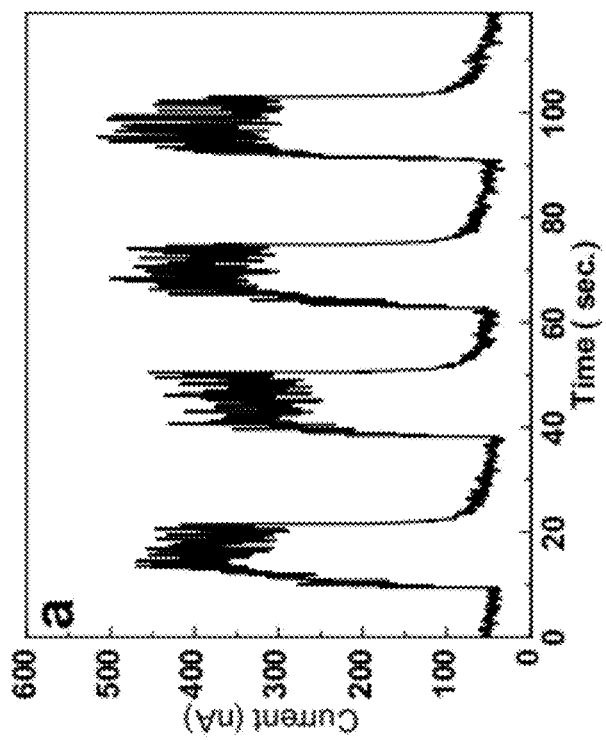
Figure 11A
Figure 11B

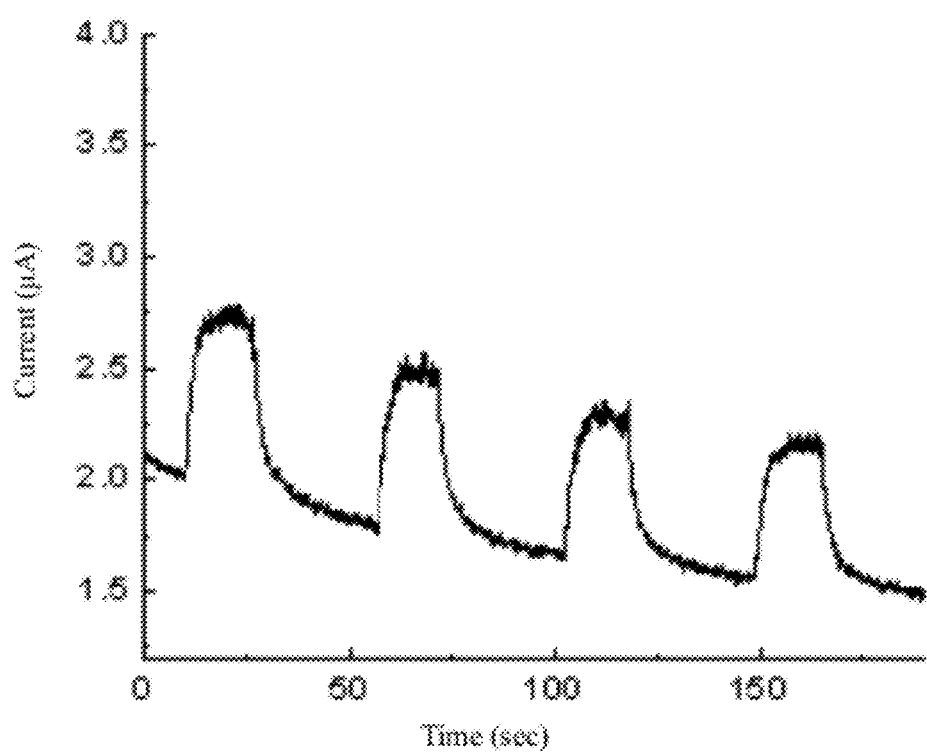
Figure 12A
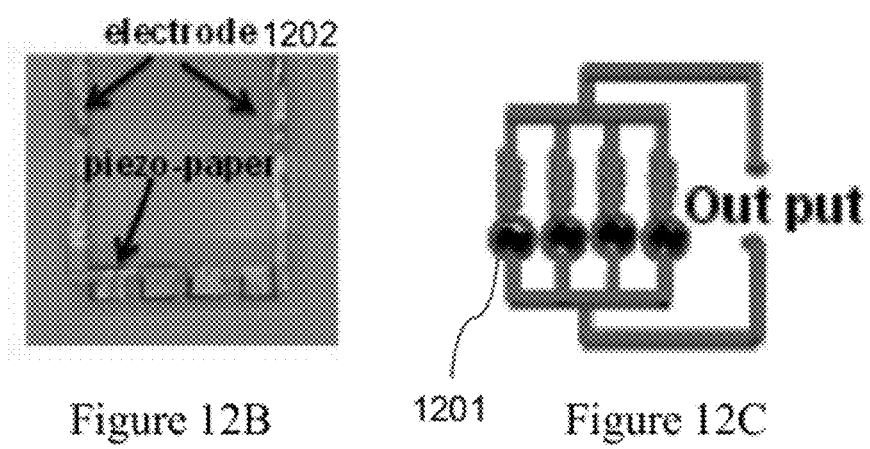
Figure 12B
Figure 12C

COMPOSITION FOR ENERGY GENERATOR, STORAGE, AND STRAIN SENSOR AND METHODS OF USE THEREOF

CROSS-REFERENCE TO RELATED PATENT APPLICATIONS

This application claims priority to: provisional U.S. Patent Application Ser. No. 61/146,421, filed on Jan. 22, 2009, entitled "Multifunctional Integrated Composite Unit For Energy Generator, Storage And Strain Sensor And Methods of Use Thereof," which provisional patent application is commonly assigned to the assignee of the present invention and is hereby incorporated herein by reference in its entirety for all purposes.

BACKGROUND

1. Field of the Invention

This invention relates generally to compositions and devices for harvesting electrical energy from mechanical and thermal energy, storing such produced energy and/or sensing strain and methods regarding same.

2. Background of the Invention

Energy harvesting from ambient environment has become an exciting research field [Sodano, H. A., et al., Comparison of Piezoelectric Energy Harvesting Devices for Recharging Batteries, *Journal of Intelligent Material Systems and Structures* 16, 799-807 (2005)] due to their possible applications in a range of areas including smart textiles, self-powered sensors, and electronics. Developing new and facile approaches to build multifunctional materials to be used in such smart applications is of great interest. [Sodano, H. A., et al., Estimation of Electric Charge Output for Piezoelectric Energy Harvesting, *Strain*, 40, 49-58 (2004)]. Recent reports have focused on using vapor phase grown nanowires of piezoelectric materials on solid substrates to build such energy harvesting systems. [Wang, Z. L., et al., Piezoelectric Nanogenerators Based on Zinc Oxide Nanowire Arrays, *Science*, 312, 242 (2006) ("Wang 2006")].

The growing need for renewable alternative sources of energy has motivated significant effort to develop new forms of energy conversion and storage devices. [Leijon, M., et al., Economical considerations of renewable electric energy production—especially development of wave energy, *Renewable Energy*, 28, 1201(2003) ("Leijon 2003")]. Conversion of mechanical energy to electrical energy could play a key role in developing remote access electronic devices, self-powered sensors or implantable medical devices. This can be done using piezoelectric materials and such energy harvesting idea has been shown to be attractive because of their capability for harvesting energy from unused power in various forms (e.g. vibrations, flowing water, wind, human motion and shock waves). [Beeby, S. P., et al., Energy harvesting vibration sources for Microsystems applications, *Meas. Sci. Technol.*, 17, R175 (2006)]. Several types of piezoelectric materials such as ceramics (lead zirconium titanate), polymers (poly(vinylidene fluoride)) and macro fiber composites have been successfully used for harvesting energy under a large spectrum of vibration frequencies. [Polla, D. L., et al., Processing and Characterization of Piezoelectric Materials and Integration into Microelectromechanical Systems, *Annu. Rev. Mater. Sci.*, 28, 563(1998); Zhou, J., et al., Dissolving Behavior and Stability of ZnOWires in Biofluids A Study on Biodegradability and Biocompatibility of ZnO Nanostructures, *Adv. Mater.*, 18, 2432 (2006) ("Zhou 2006")]. Among these, ZnO is a unique material that combines semiconductor and piezoelectric properties [Zhou 2006] and the ease of low cost manufacturing makes it ideal candidate for energy harvesting applications. [Zhou 2006; Wang, X., et al., Direct Current Nanogenerator Driven by Ultrasonic Waves, *Science*, 316, 102 (2007) ("Wang I 2007"); Wang, X., et al., Integrated Nanogenerators in Biofluid, *Nano Lett.* 7, 2475 (2007) ("Wang II 2007"); Wang, Z. L., Nanopiezotronics, *Adv. Mater.*, 19, 889 (2007) ("Wang III 2007"); Gao, P. X., et al., Nanowire Piezoelectric Nanogenerators on Plastic Substrates as Flexible Power Sources for Nanodevices, *Adv. Mater.*, 19, 67 (2007) ("Gao 2007"); Liu, J., et al., Carrier Density and Schottky Barrier on the Performance of DC Nanogenerator, *Nano Lett.*, 8, 328 (2008) ("Liu I 2008"); Qin, Y., et al., Microfibre-nanowire hybrid structure for energy scavenging, *Nature*, 451, 809 (2008) ("Qin 2008"); Liu, J., et al., Toward high output-power nanogenerator, *Appl. Phys. Lett.*, 92, 173105(2008) ("Liu II 2008"); Lao, C. S., et al., ZnO Nanobelt/Nanowire Schottky Diodes Formed by Dielectrophoresis Alignment across Au Electrodes, *Nano Lett.*, 6, 263 (2006)].

The piezoelectric properties of both bulk and nanostructured zinc oxide have been studied both experimentally and theoretically. [See, e.g., Schubert, M. A., et al., Finite Element method calculations of ZnO nanowires for nanogenerators, *Appl. Phys. Lett.*, 92, 122904 (2008); Lovesey, S. W., et al., Polar multipoles in wurtzite-like crystals (ZnO, GaN), *J. Phys.: Condens. Matter*, 20, 122201(2008); Wu, X., et al., Systematic treatment of displacements, strains, and electric fields in density functional perturbation theory, *Phys. Rev. B*, 72, 0335105 (2005); Hill, N. A., et al., First-principles study of strain-electronic interplay in ZnO: Stress and temperature dependence of the piezoelectric constants, *Phys. Rev., B* 62, 8802 (2000); Xiang, H. J., et al., Piezoelectricity in ZnO nanowires: A first-principles study, *Appl. Phys. Lett.*, 89, 223111(2006)]. Wang and coworkers have developed aligned arrays of zinc oxide nanowires by vapor-liquid-solid process on GaN and sapphire substrates and have utilized them for current generation based on the deflection/vibration of the nanowires. [Zhou 2006; Wang I 2007; Wang II 2007; Wang III 2007; Gao 2007; Liu I 2008; Qui 2008]. In all these, fabrication procedures involve multi step materials processing methods and difficult fabrication of devices using precise manipulators, making it challenging for scalable and cost-effective manufacturing of devices. Accordingly, there is a need for innovative, inexpensive, scalable technologies based on new materials and engineering approaches.

Critical infrastructure including highways, buildings, bridges, aircrafts, ships, pipelines, etc., form the lifeline of economic and industrial hubs and are sometimes subjected to severe loading conditions due to extreme events such as earthquakes, hurricanes and other natural disasters during their lifetime. In order to prevent catastrophic failures and subsequent loss of life it is essential to continuously monitor the state of the structure and identify any initiation of damage in real time. Structural health monitoring (SHM) provides an autonomous way of tracking changes in the system in real time using a combination of instrumentation systems and analytical methods. Instrumentation systems consist primarily of transducers to measure physical quantities such as displacements, accelerations etc. which can give insight into the behavior of structures. Among the quantities of interest for SHM, strain is a local and direct measure of the state of the structure and hence is widely used as a reliable indicator of the damage induced in the structure. Strain sensors hence are extensively used in SHM applications. [Ausanio, G., et al., Magnetoelastic sensor application in civil buildings monitoring, *Sensors Actuators: A Physical*, 123/124, 290 (2005);

Ansari F, Fiber optic health monitoring of civil structures using long gage and acoustic sensors, *Smart Mater. Struct.,* 14, Si (2005)].

Strain gauges or transducers can be broadly classified into optical sensors, resistance based sensors and piezoelectric sensors. Among them, resistance based sensors form the major portion of commercially available foil strain gage sensors. Recent research in development of resistance sensors based on carbon nanotubes [Dharap, P., et al., Nanotube film based on SWNT for macrostrain sensing, *Nanotechnology Journal*, 15(3), 379 (2004)] and their composites [Kang, I., et al., A carbon nanotube strain sensor for structural health monitoring, *Smart Mater. Struct.* 15, 737 (2006) ("Kang 12006"); Ramaratnam A, et al., Reinforcement of piezoelectric polymers with carbon nanotubes: pathway to next generator sensors, *Journal of Intelligent Materials Systems and Structures,* 17, 199 (2006)] has accelerated since the discovery of carbon canotubes (CNTs) and their excellent electromechanical properties. However, CNT based sensor technology is yet to find commercial applications and is still in the development stage. Further power requirements are a major limitation and a bottle neck for large scale deployment of instrumentation for SHM. Hence, strain transducers with low power requirements are highly desirable.

Piezoelectric materials have the ability to convert mechanical energy into electrical energy and have long been used for strain sensing. Among other type of sensors, piezoelectric sensors have lowest power requirements [Park, G., et al., Energy Harvesting for Structural Health Monitoring Sensor Networks, *Journal of Infrastructure Systems*, Vol. 14, No. 1, 64 (2008)] and the charge output from piezoelectric sensors lie within the range of measurement capabilities of commercially available A/D sensors. Lead Zirconate Titanate (PZT) is a common piezoelectric material that is commercially used for piezoelectric actuators and sensors. Recently, Wong and co-workers fabricated ZnO piezoelectric fine wire based strain sensor, wherein ZnO fine wire were laterally bonded with polystyrene (PS) substrate. [Zhou, J., et al., Flexible Piezotronic Strain Sensor, *Nano Lett.,* 8(9), 3035 (2008) ("Zhou 2008")]. The change in I-V behavior of wire as a function of strain was explained based on combined effects from strain induced band structure change and piezoelectricity result in the change of Schottky barrier height. [Zhou 2008].

Single crystal of piezoelectric materials like PZT or ZnO, used as strain sensor are usually bonded on the surface or embedded inside the host structure for strain measurement and have limitations to measure strain at discrete points and in a fixed direction. [Fixter, L., et al., State of the Art Review—Structural Health Monitoring, *Smart Materials, Surfaces and Structures Network (Smart. Mat) Report* (2006) ("Fixter 2006")]. Piezoelectric materials are very hard ceramic materials that are not amenable to flexible uses and very weak in tension. [Fixter 2006]. On the other hand, fabrication of flexible piezoelectric sensors or actuators requires special fabrication techniques making it uneconomical for use on a large scale for SHM applications. Therefore, there is a need to develop simple, inexpensive and flexible sensors that can be embedded into the material or form fitted easily onto an existing structure and used for multidirectional sensing over a practically viable sensing region. Avoiding lead based products is also eco-friendly and essential for use in next generation technology.

SUMMARY OF THE INVENTION

This invention relates to compositions and devices for harvesting energy from mechanical motion and/or thermal energy, storing the energy produced and/or sensing strain and methods regarding same.

In general, in one aspect, the invention features a composite material that includes a flexible polymer and a nanostructured piezoelectric material embedded in the flexible polymer. The composite material is flexible.

Implementations of the invention can include one or more of the following features:

The composite can be operable for the use of harvesting electrical energy from mechanical energy, harvesting electrical energy from thermal energy, storing harvested energy, sensing strain, or combinations thereof.

The flexible polymer can include cellulose, paper, or combinations thereof.

The flexible polymer can be porous.

The nanostructured piezoelectric material can include zinc oxide, lead titanate, barium titanate, or combinations thereof.

The nanostructured piezoelectric material can include zinc oxide.

The nanostructured piezoelectric material can coat the flexible polymer.

The nanostructured piezoelectric material can include at least about 50 weight percent of the composite material. The nanostructured piezoelectric material can include between about 40 weight percent and 50 weight percent of the composite material.

The nanostructure piezoelectric material can include nanorods. The nanorods can have an average diameter between about 40 nm to about 100 nm and the nanorods can have an average length between about 500 nm to about 1000 nm.

In general, in another aspect, the invention features a method that includes selecting a flexible polymer and embedding a nanostructured piezoelectric material on the flexible polymer using a solvothermal process to form a flexible composite material.

Implementations of the invention can include one or more of the following features:

The method can further include using the composite material in harvesting electrical energy from mechanical energy, harvesting electrical energy from thermal energy, storing harvested energy, sensing strain, acoustic sensing, or combinations thereof.

The flexible polymer can include cellulose, paper, or combinations thereof.

The flexible polymer can be porous.

The nanostructured piezoelectric material can include zinc oxide, lead titanate, barium titanate, or combinations thereof.

The nanostructured piezoelectric material can include zinc oxide.

The nanostructured piezoelectric material can coat the flexible polymer.

The nanostructured piezoelectric material can include at least about 50 weight percent of the composite material.

The solvothermal process can uniformly coat the flexible polymer with the nanostructured piezoelectric material.

The solvothermal process can include the formation of nanorods of the nanostructured piezoelectric material.

In general, in another aspect, the invention features a method that includes selecting a flexible and porous polymer. The flexible and porous polymer includes cellulose, paper, or combinations thereof. The method further includes embedding and coating a zinc oxide piezoelectric material on the flexible polymer using a solvothermal process to form a composite material. The solvothermal process uses a zinc acetate solution to embed and coat the flexible polymer with the zinc oxide piezoelectric material.

Implementations of the invention can include one or more of the following features:

The solvothermal process can include covering a surface of the flexible polymer with the zinc acetate solution. The solvothermal process can include adding a hydroxide solution to the surface to form and grow zinc oxide nanoparticles. As the concentration of zinc oxide nanoparticles grows a quasi-continuous film can be formed that serves as seed for the growth of zinc oxide nanorods.

The method can further include using the composite material for harvesting electrical energy from mechanical energy, harvesting electrical energy from thermal energy, storing harvested energy, sensing strain, or combinations thereof.

In general, in another aspect, the invention features an apparatus that includes a composite material that has a porous polymer embedded and coated with a nanostructured piezoelectric material. The apparatus is operable for harvesting electrical energy from mechanical energy, harvesting electrical energy from thermal energy, storing harvested energy, sensing strain, or combinations thereof.

Implementations of the invention can include one or more of the following features:

The composite material can be used as an energy harvesting material in the apparatus.

The apparatus can further include a storage having an array of conductive one-dimensional nanostructures embedded in a polymer matrix including an electrolyte. The apparatus can further include interconnects and electrodes operatively connected to the energy harvesting material and the storage.

The composite material can be flexible.

The apparatus can include a plurality of devices. The first device of this plurality includes the composite material. Furthermore, the second device of this plurality can include material comprising a second porous polymer embedded and coated with a nanostructured piezoelectric material. Moreover, the plurality of devices can be operatively connected. And, at least some of the plurality of devices can be connected in series or parallel. The composite material and the second composite material can be the same type. The composite material and the second composite material can be different type.

The plurality of devices can include at least ten devices that are connected in series or parallel.

The foregoing has outlined rather broadly the features and technical advantages of the invention in order that the detailed description of the invention that follows may be better understood. Additional features and advantages of the invention will be described hereinafter that form the subject of the claims of the invention. It should be appreciated by those skilled in the art that the conception and the specific embodiments disclosed may be readily utilized as a basis for modifying or designing other structures for carrying out the same purposes of the invention. It should also be realized by those skilled in the art that such equivalent constructions do not depart from the spirit and scope of the invention as set forth in the appended claims.

BRIEF DESCRIPTION OF THE DRAWINGS

For a detailed description of the preferred embodiments of the invention, reference will now be made to the accompanying drawings in which:

FIG. 11A depicts a graph that shows the closed circuit current response of ZnO coated paper devices.

FIG. 11B depicts a graph showing the open circuit voltage response of a ZnO-coated paper device.

FIG. 12A depicts a graph that shows closed circuit current response of stacked ZnO coated paper devices.

FIG. 12B shows a photograph of a 4-stack of ZnO coated paper devices.

FIG. 12C illustrates a 4-stack of ZnO coated paper devices connected in parallel.

NOTATION AND NOMENCLATURE

Figure 1B:
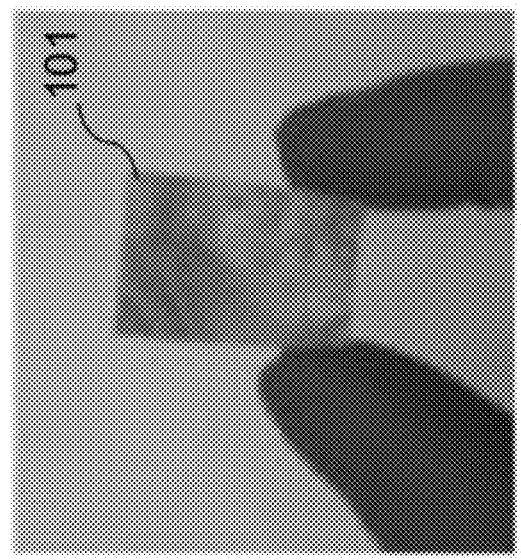
FIG. 1B is another photograph of the piezo Zn coated paper of FIG. 1A.

Certain terms are used throughout the following description and claims to refer to particular system components. This document does not intend to distinguish between components that differ in name but not function.

In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections.

As used herein, a material (such as a polymer or a composite) is "flexible" if a sample of the material meets the following criteria: At room temperature and pressure, a sample of the material—having length/width/depth dimension of 2 cm×2 cm×0.47 mm—can be bent in the direction of its length (or width) to a radius of curvature of at least 0.63 cm and is fully recoverable (i.e., it can fully recover to its pre-stressed state). If a sample of the material meets that criteria, the material is flexible regardless of its actual dimensions (i.e., even when the material has dimensions other than 2 cm×2 cm×0.47 mm). Examples of flexible materials include cellulose and paper.

DETAILED DESCRIPTION

An interesting platform material to use in designing energy harvesting devices is cellulose (main component of common paper) since it is a cheap, light-weight, abundant, eco-friendly and technologically viable material. [Klemm, D., et al., Cellulose: Fascinating Biopolymer and Sustainable Raw Material, *Angew. Chem., Int. Ed.,* 44, 3358 (2005); Fukada, E., History and recent progress in piezoelectric polymers, *IEEE Trans. Ultrason. Ferro. Freq. Contr.* 47, 1277 (2000); Kim, J., et al., Discovery of cellulose as a smart material, *Macromolecules,* 39, 4202 (2006).] Recent work shows the use of this material in making flexible energy storage devices such as batteries and supercapacitors. [Pushparaj, V. L., et al., Flexible energy storage devices based on nanocomposite paper, *Proc. Nat. Acad. Sci.* 104, 13574 (2007)].

Applicants have created a straightforward and far cheaper approach to building energy harvesting systems that utilizes flexible piezoelectric paper composed of zinc oxide nanostructures embedded in cellulose, synthesized via solvothermal process. Solvothermal process use has been previously demonstrated to make nanostructures of piezoelectric materials. [Zhang, H., et al., Synthesis of flower-like ZnO nanostructures by an organic-free hydrothermal process. *Nanotechnology* 15, 622 (2004).] Applicants have designed an approach to embed such materials in a secondary flexible matrix (paper) to make a composite material. This nanocomposite piezoelectric paper can be used as an energy conversion device as well as dynamic strain sensor to transform mechanical energy to electrical energy or sensing strain/vibration over a large frequency bandwidth. The packaged devices that could be fabricated over large areas are mechanically flexible and robust and could be easily form fitted and integrated with any existing device or structure. The paper-based devices transform ultrasonic wave energy into electrical energy and are also able to monitor dynamic strain over a large frequency range. The output current density and output voltage of piezo-paper is approximately 0.6 $\mu A/cm^2$ and approximately 40 mV respectively, and a power output of approximately 11 $nW/cm^2$ is achieved. The strain sensor is demonstrated to work in the frequency range of about 0.1 Hz to about 40 KHz and performance is comparable to commercial available strain gauge. The approach presents an adaptable, scalable, mobile, and cost-effective technology for harvesting energy from the environment, and it offers a potential solution as powering devices as well as inexpensive strain sensors.

The present invention is a new multifunctional device that is capable of harvesting energy from mechanical motion and thermal fluctuations as well as sensing strain in structures. Such device is made mainly by low cost biodegradable materials without any heavy metals. The functional parts of the device are in the nanoscale, which allows the device to be a good candidate for powering nanodevices, but is also fully scalable, meaning that could also power other devices in the micro and macroscale.

The invention is a functional flexible device for harvesting energy from the environment and sensing strain, based on low cost materials and processes. In one embodiment it includes the following: (1) a flexible polymer (e.g., cellulose, paper, or other porous materials); (2) a coating on the polymer with a nanostructured piezoelectric material (e.g., zinc oxide, lead zirconate titanate, barium titanate, etc.) grown through chemical method, which is used as the energy harvesting material; and (3) interconnects and electrodes.

The device is a good candidate for powering nanodevices. It is also fully scalable, meaning that it could also power other devices in the micro and macroscale. The device can also be used as a strain sensor in applications such as structural health monitoring systems.

The invention includes a fabrication process and device configuration.

Synthesis of Piezo-Paper

Applicant has discovered a procedure for the synthesis of a zinc oxide nanostructure-embedded cellulose films (ZnO-cellulose nanocomposite, also referred to as "piezo-paper") using a scalable, low cost, low temperature solvothermal method. The piezo-paper can be used as an energy harvesting device as well as dynamic strain sensor and the performance of these varied devices are demonstrated.

In an embodiment of the present invention, a 70 mm diameter 0.47 mm thick plain paper was soaked drop wise with a 0.1M zinc acetate dihydrate solution in ethanol at 60° C. The paper was put in a glass petri dish on a hot plate at 100° C. for drying. There, 1M solution of NaOH was added drop wise until soaked, and left to dry in the petri dish. This procedure was repeated ten times. The sample was washed with distilled water every two cycles to eliminate any by-products (i.e., sodium acetate), and the sample was dried before continuing with the next cycle. After the repeated solvothermal reaction the paper was uniformly covered with zinc oxide. The composition of zinc oxide in paper was as high as 50% (wt/wt). The growth mechanism is known for the formation of zinc oxide nanorods on a substrate through a seed layer. The mechanism can be as follows: during the first step, the zinc acetate covers the walls of the paper fibers. When the sodium hydroxide is added, the hydrolysis leads to the formation of zinc oxide nanoparticles. As the concentration of zinc oxide nanoparticles grow it becomes a quasi-continuous film, which then serves as seed for the growth of zinc oxide nanorods.

Morphological and elemental analysis was carried out using a scanning electron microscope (FEI Quanta 400) operated at 20 kV and equipped with an EDS detector. The crystalline nature of the products was determined using a X-ray diffractometer (Rigaku D/Max Ultima II) operated at 40 kV and using CuKα radiation.

The crystal structure and surface morphology characterizations of ZnO-cellulose composite paper are shown in FIGS. 1A-1B AND 2-8.

Figure 1A:
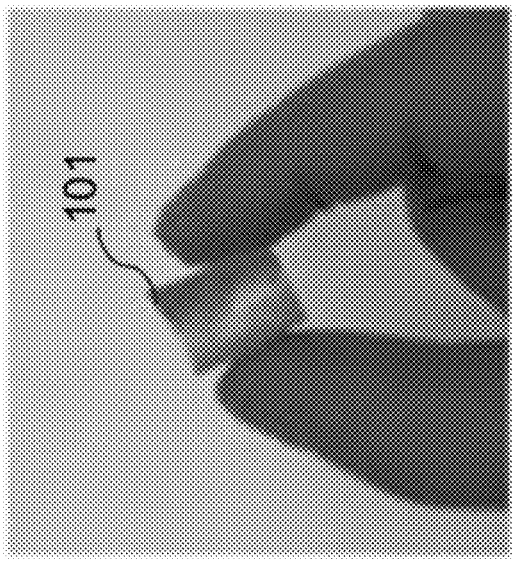
FIG. 1A is a photograph of a piezo Zn coated paper.

Photos of piezo-paper 101 are shown in FIGS. 1A-1B, which demonstrate the mechanical flexibility of the piezo paper. In FIG. 1A, piezo-paper 101 is shown as bent in one direction (the bottom direction). In FIG. 1B, the piezo-paper 101 is shown as bent in a different direction (the middle direction). The piezo-paper 101 can be fully bent and the shape change is fully recoverable (i.e., it can fully recover to its pre-stressed state upon unloading).

Figure 2:
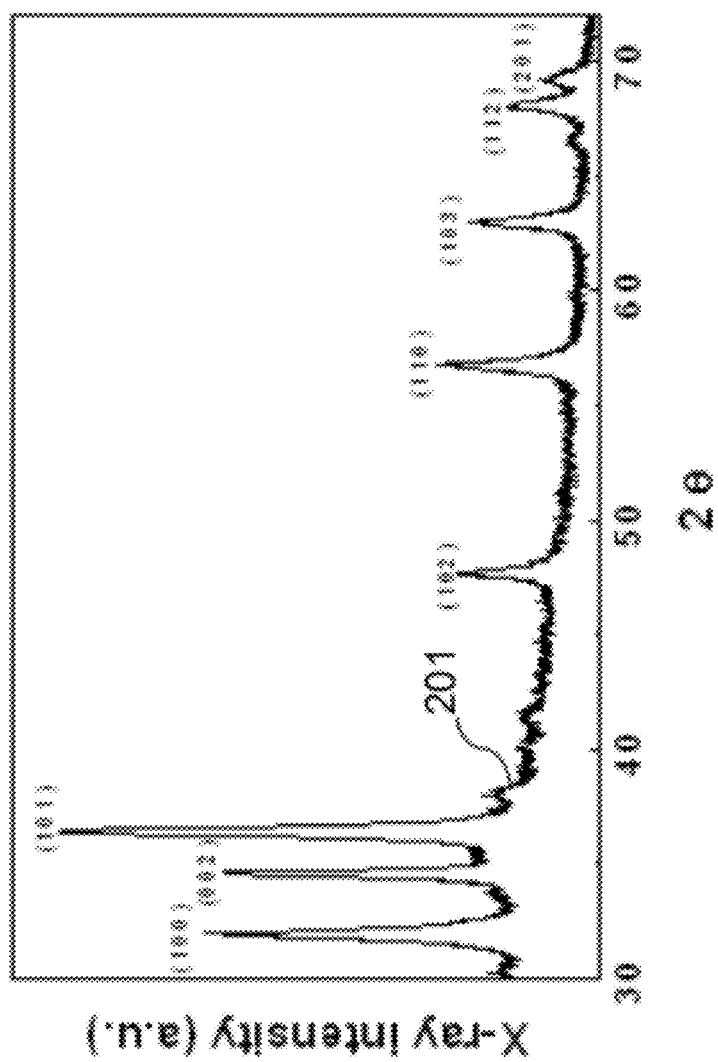
FIG. 2 depicts the XRD spectra of the piezo ZnO coated paper of FIG. 1A.

X-ray diffraction confirmed the structure of the ZnO phase present in piezo-paper 101. FIG. 2 shows the powder X-ray diffraction (XRD) spectra of the ZnO coated paper, which reflects the crystalline ZnO structure (the zinc oxide wurtzite structure). The first three peaks of trace 201 are predominant for cellulose fibers while the rest are predominant for ZnO.

Figure 3:
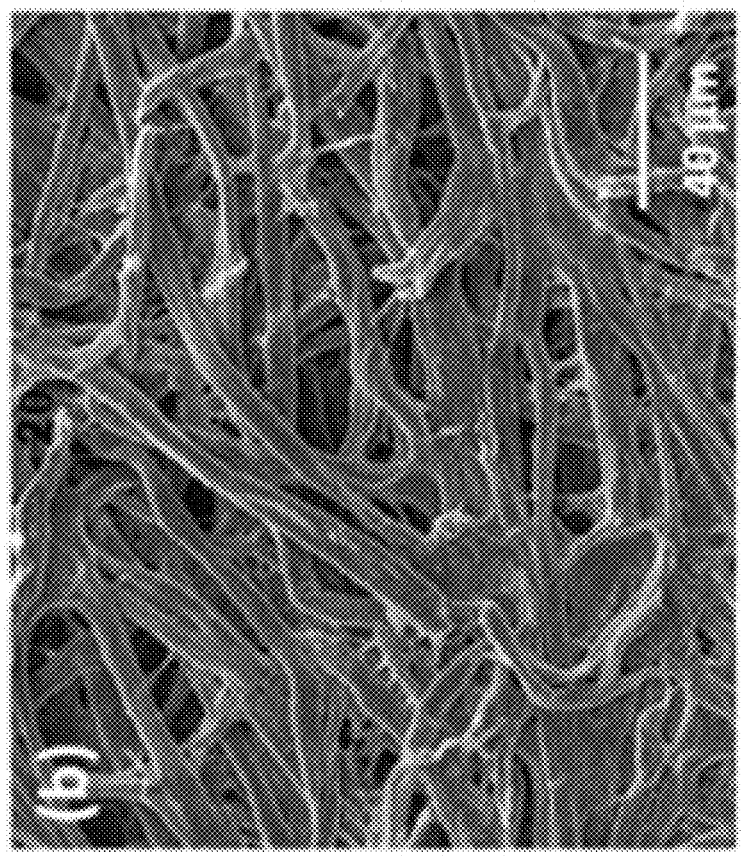
FIG. 3 is an SEM image of the structure of paper before it is coated with ZnO in an embodiment of the present invention.
Figure 4:
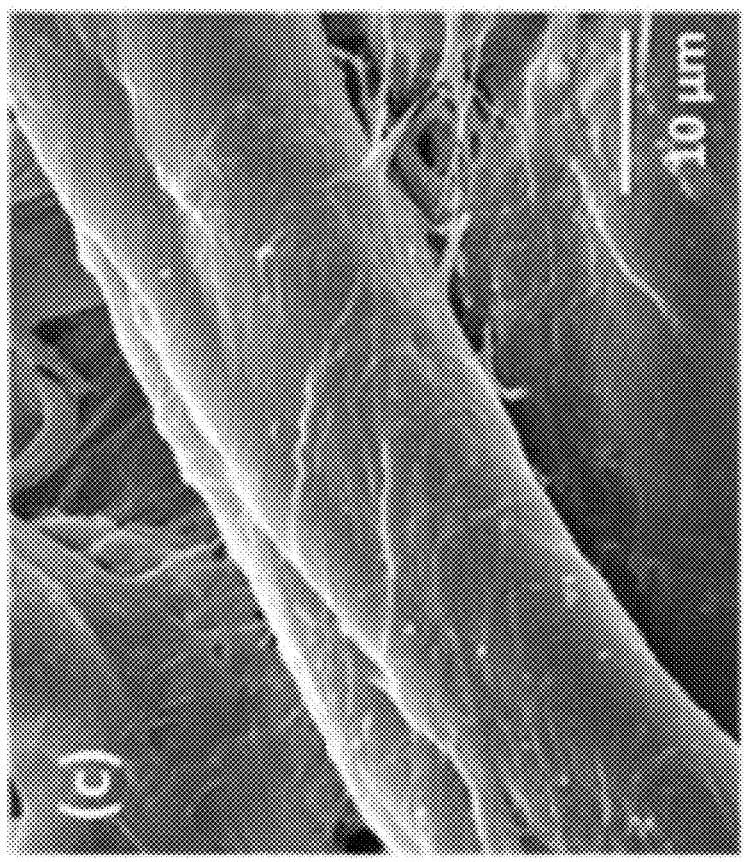
FIG. 4 is another SEM image of the structure of paper before it is coated with ZnO in an embodiment of the present invention.

FIGS. 3-4 are SEM images of the structure of paper before it is coated with ZnO that shows the porosity of the paper.

Figure 5:
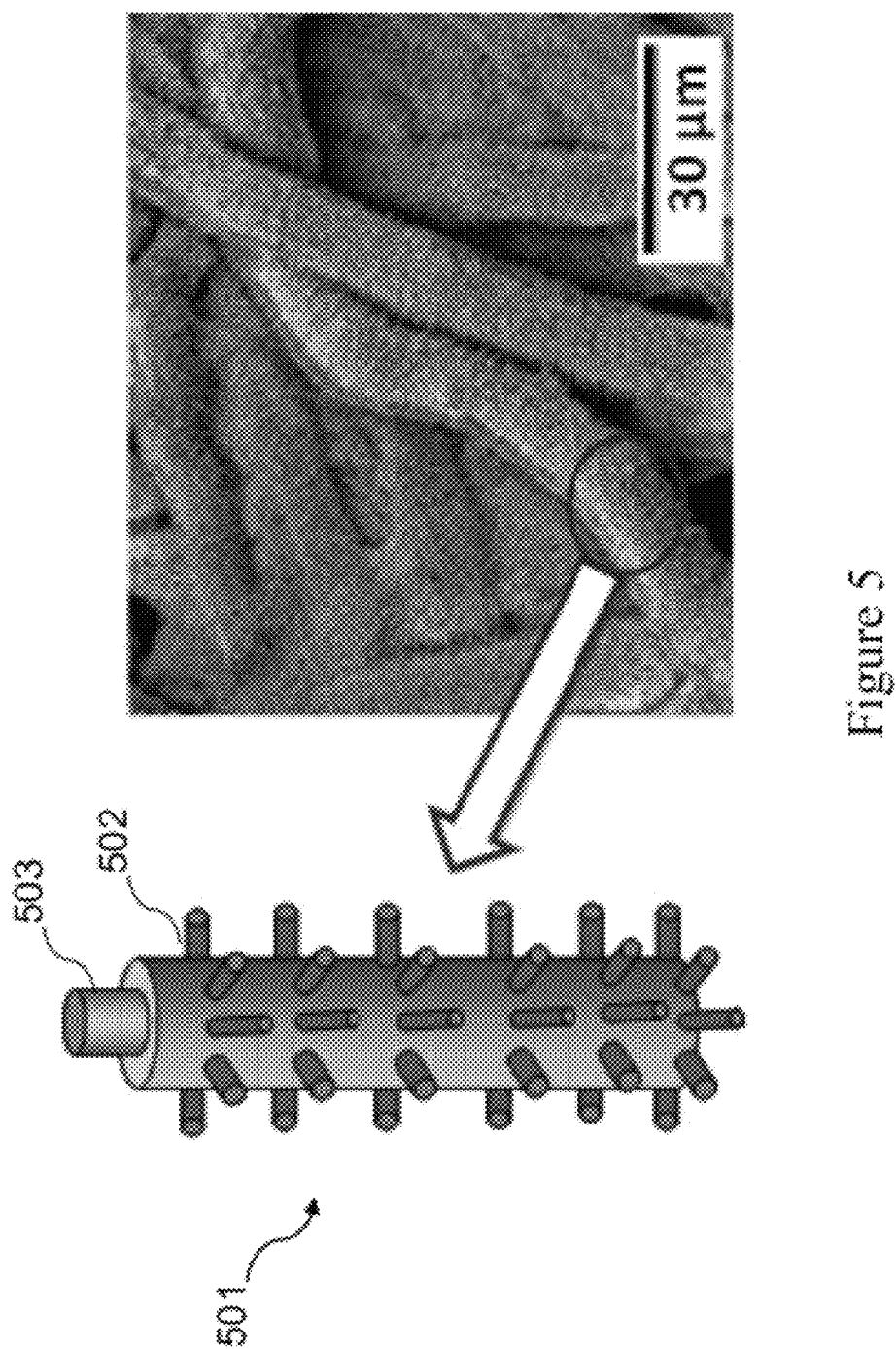
FIG. 5 is an SEM image of ZnO coated paper formed by an embodiment of the present invention.
Figure 6:
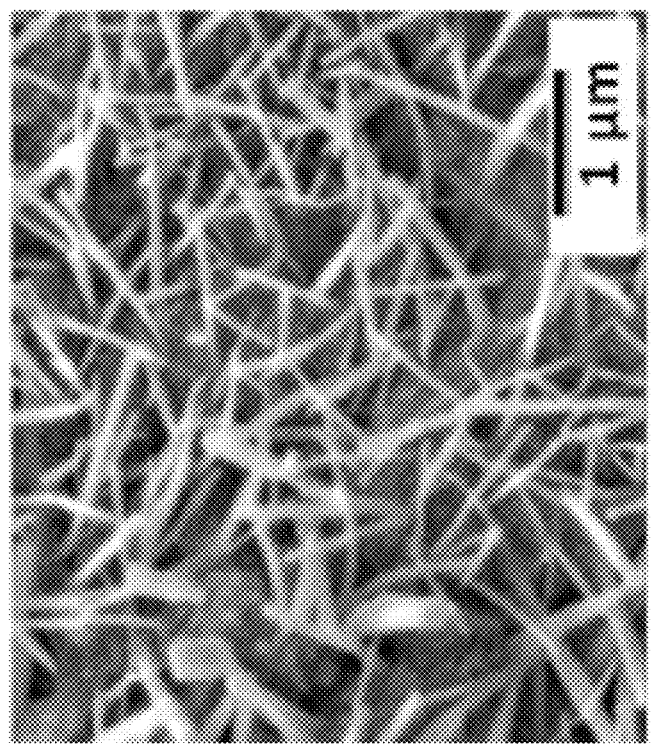
FIG. 6 is another SEM image of ZnO coated paper formed an embodiment of the present invention.
Figure 7:
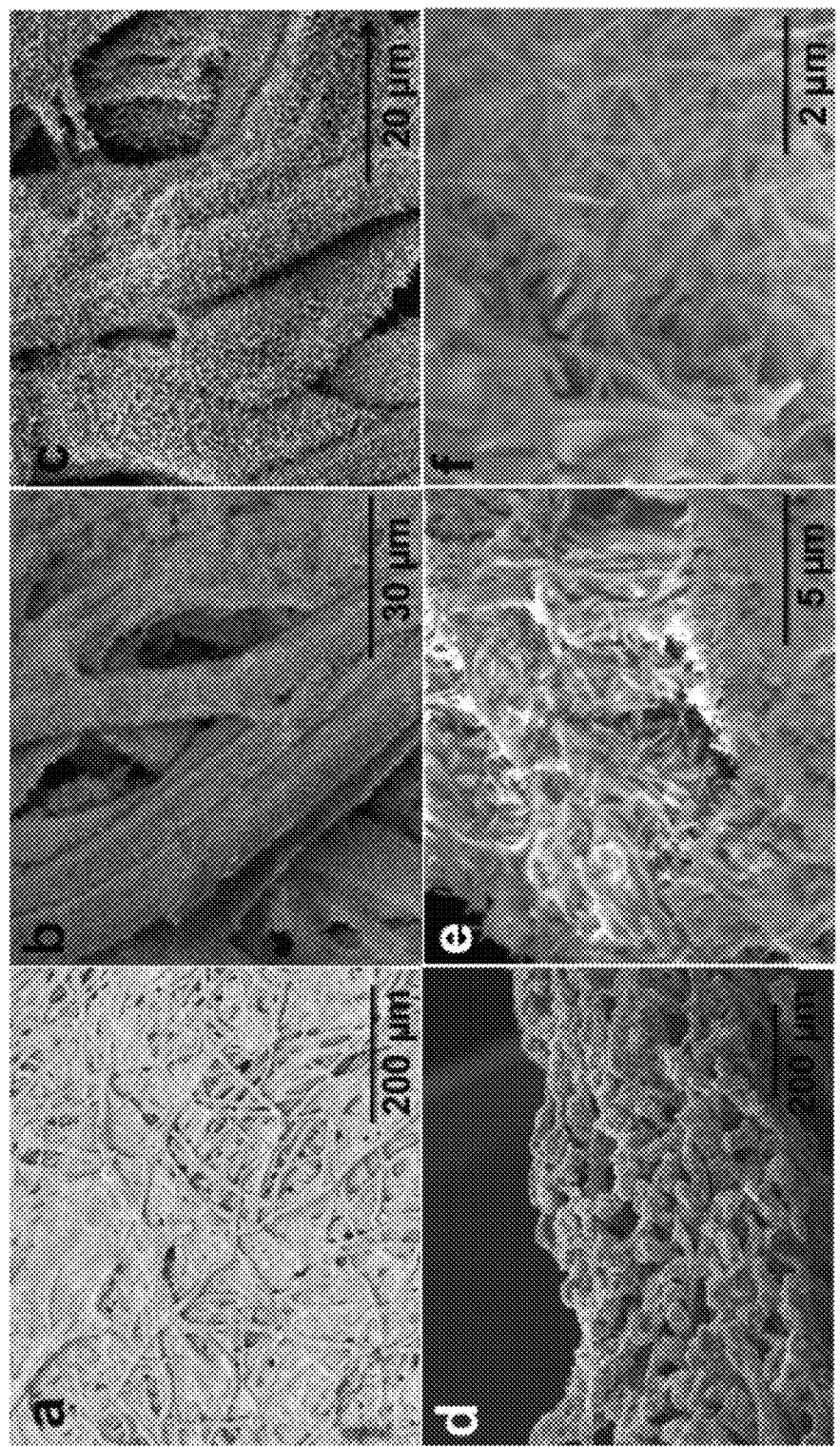
FIGS. 7A-7F are SEM images of piezo ZNO coated paper at different magnification of top view (FIGS. 7A-7C) and cross section view (FIGS. 7D-7F).

The morphology and chemical composition of the ZnO coated paper was observed by scanning electron microscopy. FIGS. 5-6 depict SEM images of ZnO coated paper formed by the solvothermal process described above, which figures show the cellulose-ZnO composite morphology. Inset 501 is a schematic depiction of the structure, a thin film of zinc oxide 502 is formed around the paper fiber 503, which in turn seeds the growth of the zinc oxide nanorods.

Figure 8:
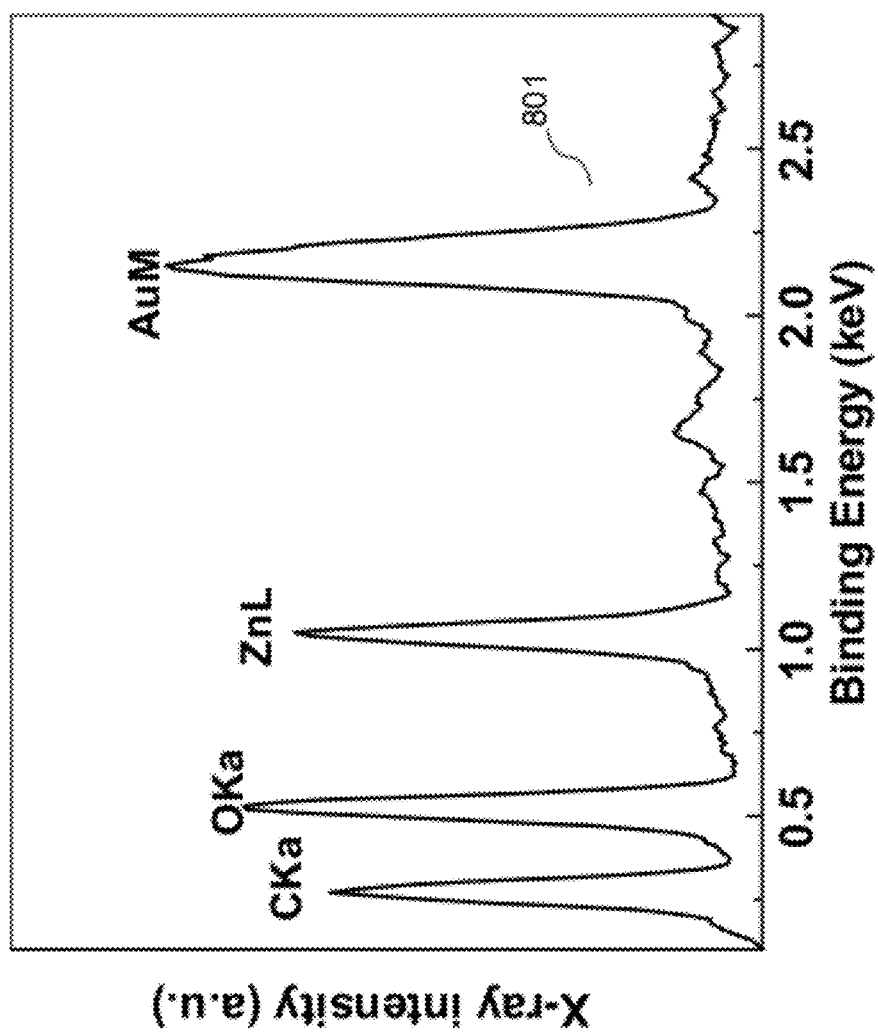
FIG. 8 shows an energy dispersive X-ray analysis of piezo ZNO coated paper formed by an embodiment of the present invention.

The ZnO nanorods formed during synthesis were coated uniformly onto the cellulose fibers. The ZnO nanorods have typical diameters in the range of about 40 nm and about 100 nm and lengths between about 500 nm and about 1000 nm. The low magnification and cross section images are shown in FIGS. 7A-7F revel that the uniform coating on the paper over large areas. FIGS. 7A-7C are top views of the piezo-paper, and FIGS. 7D-7F are cross section views of the piezo paper. FIG. 8 (curve 801) shows the energy dispersive X-ray (EDX) analysis of piezo-paper that indicates the presence of Zn, O, C and Au. Such EDX analysis confirms the formation of zinc oxide.

Energy Harvesting

Figure 9:
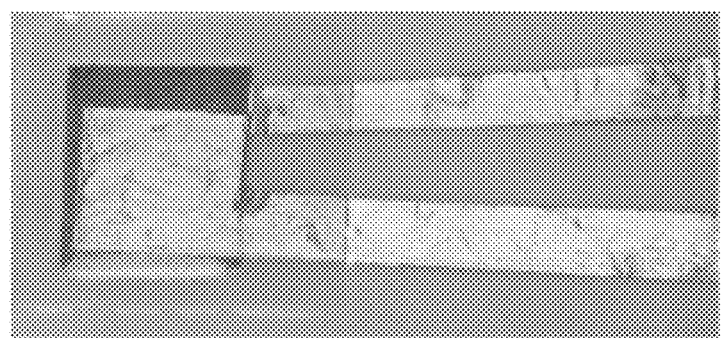
FIG. 9 is a photograph of an embodiment of the present invention prepared for testing.

In some embodiments, zinc oxide up to about 40% (wt/wt) in paper has been prepared. For the fabrication of the devices, gold was sputtered on top of both sides of the paper at 4 minutes to get an approximate 500 nm continuous film. A 1.0×0.5 cm$^2$ piece of this piezo paper was sandwiched between current collectors (copper) and laminated with a commercial ID-card laminating sleeve for isolation from water. A photo of this device is shown in FIG. 9. This was polled initially by applying a DC voltage of 20 volts for 30 seconds and then shorting the terminals for few minutes to drain out any residual charge. The same procedure was followed for the paper without ZnO, as control device.

The piezoelectric response of the prepared samples was tested by measuring the output current and voltage when the device was immersed in an ultrasonic bath (frequency around 40 kHz). While the pyroelectric response was measured my measuring the current and voltage when the device was heated on a hotplate.

Figure 10A:
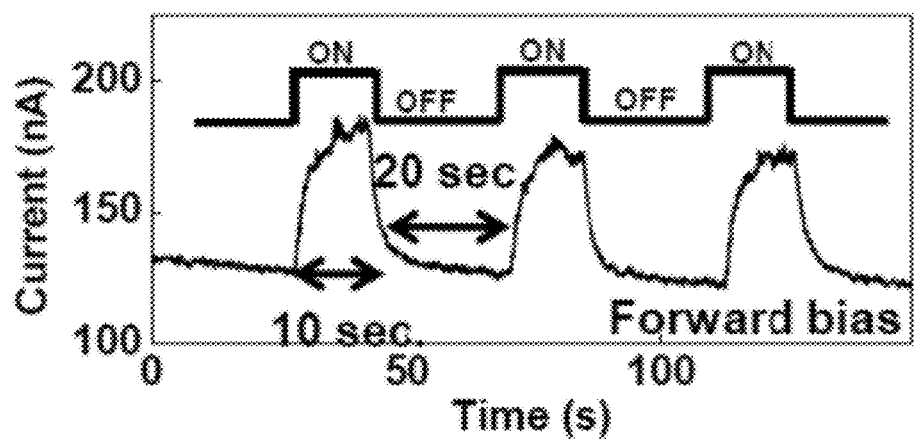
FIGS. 10A-10B depicts graphs that show the performance of the ZnO coated paper device when exposed to pulsed excitations of ultrasonic waves in forward and reverse bias, respectively.
Figure 10B:
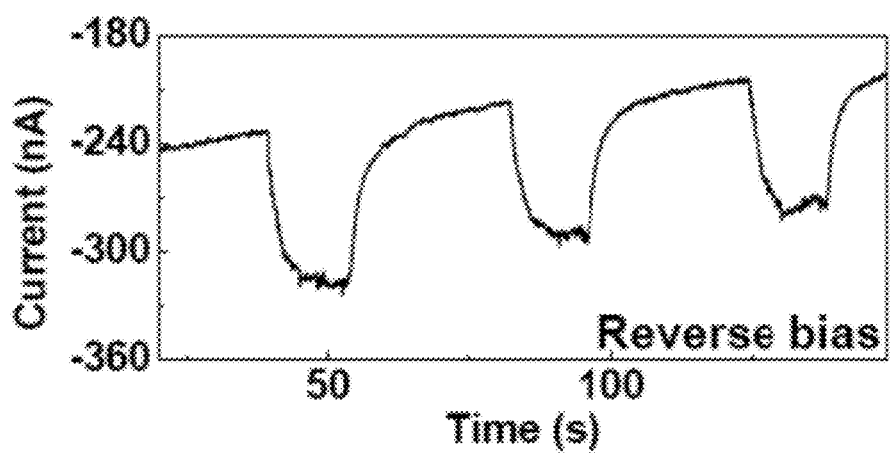

These current measurements were carried using a Keithley Series 2400 Digital Source Meter having a sensitivity of 10 pA and a sampling rate of 100 samples per second. The measurement for the voltage response was done using a DAS1414 system with a sampling rate of 500 samples per second across a commercial capacitance of 0.22 μF FIGS. 10A-10B are graphs that show the performance of the ZnO coated paper device when exposed to pulsed excitations of ultrasonic waves in forward and reverse bias, respectively. The current response of a typical 0.5 cm$^2$ device, when exposed to pulsed intervals of 10 sec of ultrasonic waves, is around 150 nA. In some preferred embodiments, the device showed a current of 200 nA, leading to a current density of 0.4 μA/cm$^2$ at 10 mV.

FIG. 11A is a graph that shows the closed circuit current response of ZnO-coated paper devices. The current response of this paper device (of size 0.5 cm$^2$) is around 322 nA, leading to the current density of 0.6 μA/cm$^2$ at 10 mV. The forward current and the reverse current was measured (by inverting the probes of the source meter) to verify that the observed response was not an artifact. The device was tested under continuous excitation for 180 seconds showing an almost constant response; however, a slight decrease of the response current of around 10% was observed over the period of time tested.

FIG. 11B is a graph showing the open circuit voltage response of a single typical ZnO-coated paper device that was improved when 10 devices were placed in series (around 40 mV).

FIG. 12A is a graph that shows closed circuit current response of stacked different ZnO-coated paper devices (4-stack). To show the scalability of the proposed device, N numbers of the typical device (0.5 cm$^2$) were stacked in series or in parallel, named N-stack. FIG. 12B shows a photograph of a 4-stack of ZnO coated paper devices 1201 (with electrodes 1202). Each of the individual devices was tested to make sure their response to mechanical vibration was consistent. For a 4-stack of ZnO coated paper devices 1201 connected in parallel (as illustrated in FIG. 12C), the currents add up, giving a total of around 500 nA during operation in similar conditions as mentioned above (i.e., the response of a single 0.5 cm$^2$ device (around 150 nA) is improved when four of similar devices are stacked in parallel (around 500 nA).

Figure 13A:
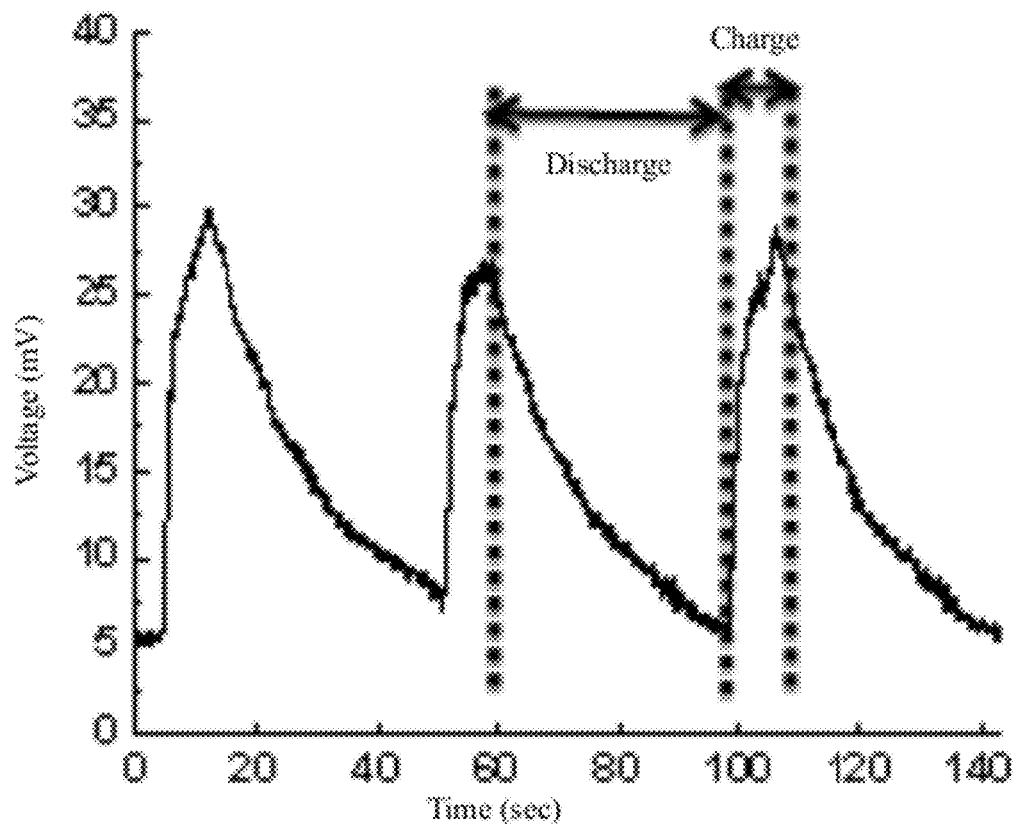
FIG. 13A depicts a graph that shows the open circuit voltage response of stacked ZnO-coated paper devices.
Figure 13B:
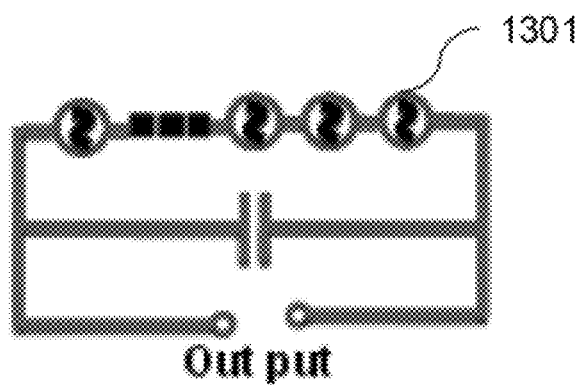
FIG. 13B illustrates a 10-stack of ZnO coated paper devices connected in series.
Figure 14:
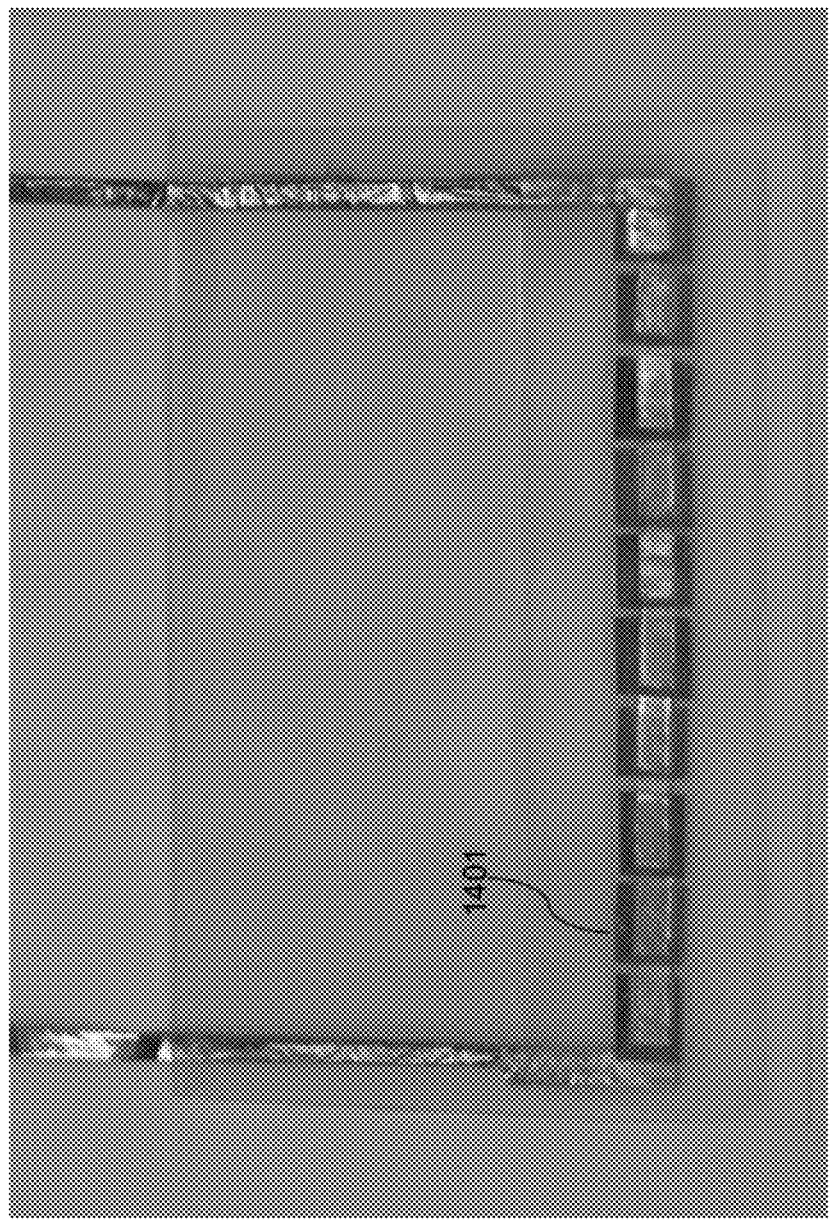
FIG. 14 is a photograph of a ZnO coated paper device having 10 devices placed in series.

FIGS. 13A-13B show that open circuit voltage response of a single typical ZnO-coated paper device is improved when 10 devices are placed in series (around 35 mV). A device having 25 mm$^2$ area with ten stacks of individual piezo-paper 1301 connected in series, was used to measure the scalability on voltage. FIG. 14 is a photograph of a ZnO coated paper device having 10 devices placed in series. FIG. 13A is a graph that shows the open circuit current response of the stacked different ZnO-coated paper devices (10-stack). As shown in FIG. 13B, the voltage measurement circuit involves a capacitive filter 1302 (0.22 μF) in parallel to the device so as to smooth the output and to obtain a stable DC voltage. The output was monitored using DAS1414 intelligent data acquisition system with a gain/input range of around 0.1V and a 350 kHz maximum sample rate, which was much higher than the frequency of excitation of the device (40 kHz). The initial output from the device without capacitive filtering was observed to be a series of highly fluctuating pulses of single polarity. By introducing the capacitive filter, these pulses were averaged out to produce a stable DC voltage. The voltage was measured in differential mode for better accuracy. The device was excited for a pulse of 15 seconds at regular intervals of 30 seconds.

The voltage versus time measurements depicted in FIG. 13A show a response of around 30 mV. The arrays of paper devices shows voltage out around 40 mV (see FIG. 11B). From FIG. 11B, the time for charging and discharging of the capacitor was 10 and 30 second, respectively. Stable outputs were observed for about 10 cycles after which the output was gradually reduced.

Figure 15A:
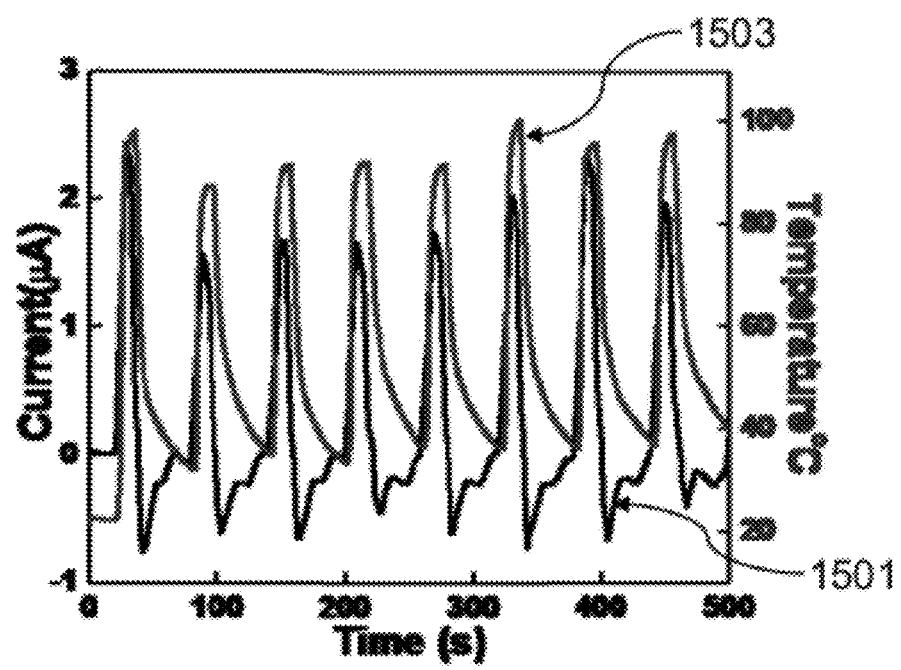
FIG. 15A depicts a graph that shows the current response of the ZnO coated paper when subjected to cycles of heating and cooling
Figure 15B:
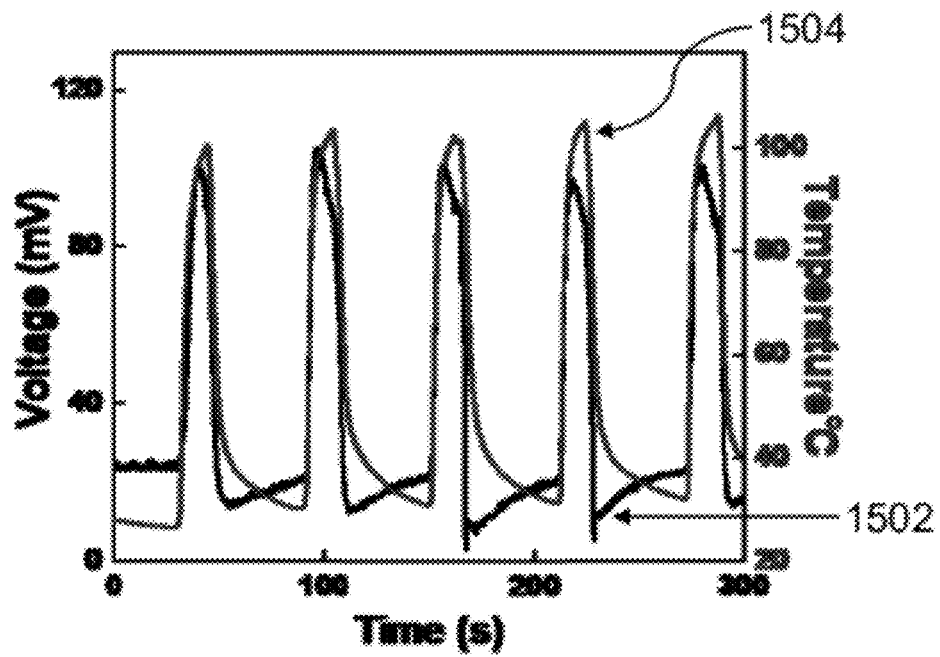
FIG. 15B depicts a graph that shows the voltage response of the ZnO coated paper when subjected to cycles of heating and cooling

The current output from the piezo paper device when heated on a hot plate is depicted in FIG. 15A in curve 1501, while the voltage output is shown in FIG. 15B in curve 1502. (Temperature is depicted on curves 1502 and 1504 in FIGS. 15A-15B, respectively). It has been observed that the power generated through thermal energy harvesting is much higher than that of the mechanical vibration. This may be because the heating process is unidirectional while the vibration is random.

The mechanism for charge collection in the vapor grown ZnO nanogerator was proposed by Wang and co-workers. [Zhou 2006]. The ZnO nanowires bent due to the external excitation by a tip or by a zigzag electrode, inducing a displacement of the cations with respect to the anions, and a voltage was generated along the nanowire diameter. A current was driven through the external circuit to neutralize the ionic charges in the nanowires and to reduce the created voltage when the top electrode touched the inner part of the deflected nanowire. The Schottky contact between the nanowire and the top electrode rectified the signal, therefore showing a DC current on the external circuit. Gösele and his group thoroughly analyzed this mechanism. [Alexe, M., et al., Energy Harvesting Using Nanowires, Adv. Mater., 20, 1 (2008) ("Alexe 2008")]. Gösele and his group suggested that the high carrier concentration and high electron mobility would cancel out the difference of potential caused by the ion displacement along the nanowire diameter after straining in less than 1 picosecond. Furthermore, they pointed out that there was no Schottky barrier at room temperature for voltages below 25 mV, so that there was no real rectification of current for the voltages harvested in such experiments. In Alexe 2008, the explanation of the observed response was the following; during scanning, the tip contacted the ZnO nanowires for a short time, and since the nanowires had a resistance which was orders of magnitude lower than the load resistance, the input RC circuit would be effectively short-circuited, thus generating a transient output signal synchronized with the position of the nanowires.

In embodiments of the present invention, the energy harvesting mechanism is slightly different from what has been suggested earlier [Zhou 2006], and can be explained as follows. The mechanical waves make the fibers vibrate, thus creating two types of stresses on the ZnO coated paper: (a) as contiguous fibers vibrate, the nanorods on their surface are rubbed against each other, causing them to deflect, and generating a potential difference (or piezoelectric potential) along the nanowire diameter; and (b) since the fibers are coated with a ZnO thin film, there is a strain due to the vibration of the fibers. The ion displacement due to this strain creates a difference of potential along the thin film, therefore increasing the time for potential screening due to the intrinsic carriers in the ZnO film. This increase in the time for potential screening allows the current to flow through the external circuit. The potential difference that drives the current from one electrode to the other is in the zinc oxide thin film, and the difference of potential within individual nanorods barely contributes. The electrodes are always making contact with the sample, so that the response observed cannot be accounted for a short circuit.

The maximum power output for the single layer devices of the present invention is generally around 11.3 nW/cm$^2$ for mechanical energy harvesting and around 40 nW/cm$^2$ for thermal energy harvesting. The best power output achieved in previous reported work using vapor grown nanowire devices is higher 83 nW/cm$^2$. [Liu II 2008]. The output power is less, yet comparable, to previous reported best values; however piezo-paper is quite easy to synthesize by inexpensive process, which makes the present invention appealing. For instance, to power a 10 mW small motor, embodiments of the present invention generally would require around 22 m$^2$ of paper; while for other reported devices would require around 12 m$^2$ of Si or GaN wafer grown nanowire arrays. The low cost of paper, its light weight, ease of fabrication of the devices and the mechanical flexibility should make the piezo-paper based devices of the present invention quite competitive in applications compared to previously reported nanogenerator technologies. Moreover, by using thinner paper matrices, the performance can be improved (although this might compromise the mechanical flexibility of the devices).

Energy Storage

Uniform films of vertically aligned thin-walled multi-walled carbon nanotubes (MWCNT) were grown on silicon substrates by using a thermal-chemical vapor-deposition method. Unmodified plant cellulose dissolved in RTIL ([bmIm][Cl]) was infiltrated into the MWCNTs to form a uniform film of cellulose and ([bmIm][Cl]), embedding the MWNT. After solidification on dry ice, this nanocomposite was immersed in ethanol to partially or completely extract excess RTIL and dried in vacuum to remove residual ethanol. This composite paper was used as stack with the energy conversion devices to store energy generated from piezo paper.

A piezoelectric energy harvesting devices needs bulky, complicated electronic rectifiers to transform the generated AC signal generated into a DC voltage to efficiently charge the energy storage system. These circuits were avoided by coating gold on ZnO coated paper which form Schottky junction with ZnO film and also acts as current collector. 200 nm thick gold film was coated by sputtering on both side of paper. Copper foil was used as current collect. Piezo-paper was placed between two copper foils and this sandwich structure was laminated using commercial available laminating sheet to insulate from water. The device (such as shown in FIG. 14) having 25 mm$^2$ area with ten stacks of individual piezo-paper connected in series and parallel configuration to measure the scalability on voltage and current respectively.

Strain Sensors

Using the piezo-paper of the present invention, such as used in the energy harvesting device disclosed herein, effective strain sensors have been built, thus making this material multi-functional.

Dynamic

Figure 16:
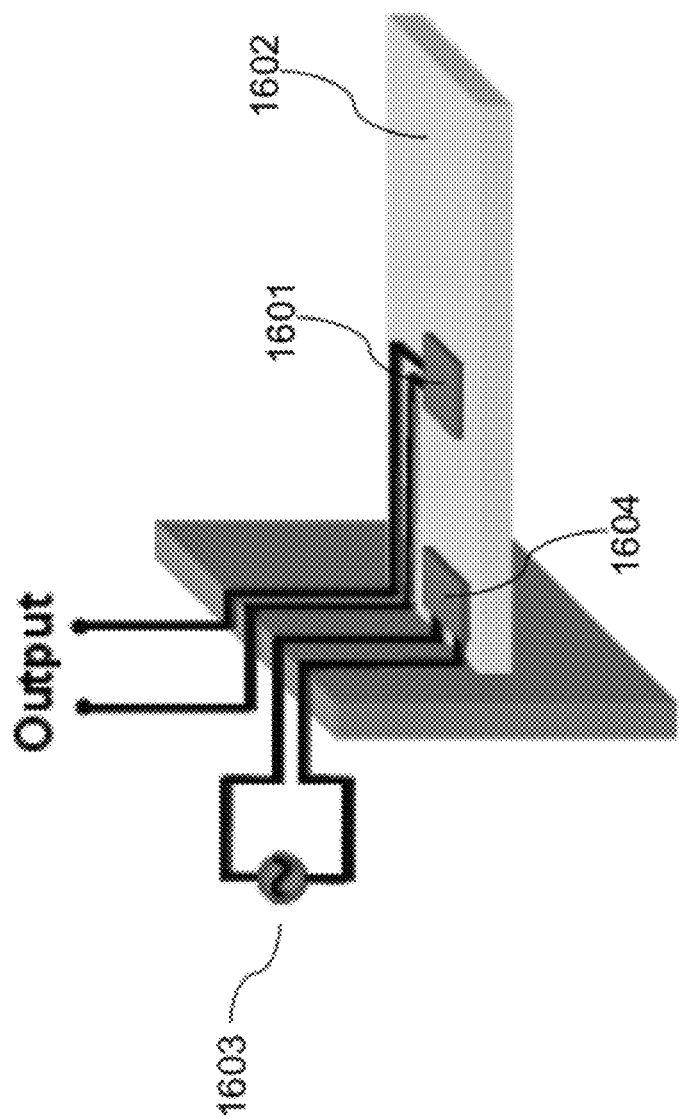
FIG. 16 is a schematic diagram of dynamical strain measurement setup in ZnO coated paper.

The dynamic strain response of piezo-paper has been demonstrated under different exciting frequencies (from 0.1 Hz to 40 Hz). FIG. 16 is a schematic diagram of dynamical strain measurement setup including piezo-paper 1601 on a mounted strip 1602. The piezo-paper 1601 was attached to a beam 1602 (such as a 16×2×0.03 inch$^3$ aluminum strip having a Young's modulus of 69 GPa) such as using superglue. The vacuum bonding method was used to ensure that the superglue produced a firm, thin and stiff bond such that no slippage occurred between the aluminum specimen and piezo-paper. Superglue film acted as a stiff bond between the piezo-paper 1601 and the conducting aluminum specimen for perfect strain transfer and for insulation. Another commercial electrical resistance strain gauge was attached on the opposite side of the aluminum specimen for strain measurement comparisons. [Alexe 2008].

For dynamic loading, the aluminum beam was clamped at one end and left free at the other end. The metal strip was exited with various frequencies using a piezoelectric actuator 1604 (such as a commercial piezo-patch from MIDE Inc., Boston, Mass.). Actuation to the beam was controlled using a dSPACE board in conjunction with a power amplifier. The beam underwent compressive and tensile strains upon excitation with the commercial piezo-patch 1604. The current response from the ZnO paper was observed using a Keithley meter.

Figure 17:
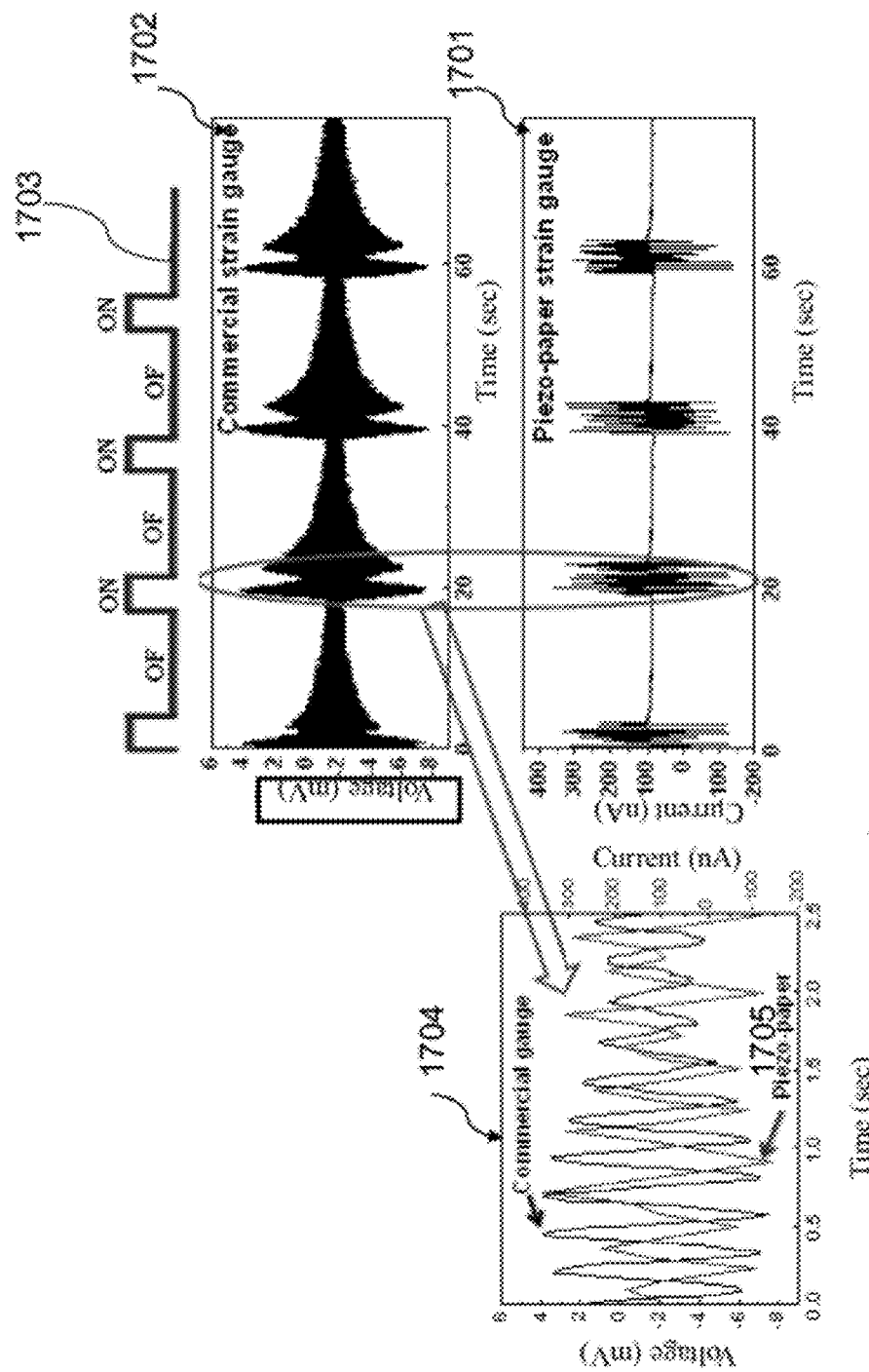
FIG. 17 depicts graphs that show the response of commercial strain gauge and piezo-paper on excitation of the setup of the schematic diagram of FIG. 15 and a comparison of the output of these commercial strain gauge and piezo-paper during excitation.

The beam was excited with the external piezo-patch 1604 for a range of frequencies and the response of the piezo-paper and commercial strain gauge was monitored simultaneously over many cycles of repeated compression and stretching, as shown in FIG. 17 (in graphs 1701 and 1702 for piezo-paper strain gauge and commercial strain gauge respectively). The response of the commercial strain gauge and piezo-paper was quite similar during the pulse 1703. There is no time lag in response between commercial strain gauge and piezo-paper. Graph 1702 is the response of the commercial gauge (shown in curve 1704) and piezo-paper (shown in curve 1705) during the excitation of the beam. The response from both sensors was in phase indicating that the piezo-paper sensor measured the strain signal from the structure without much distortion and was comparable to what was obtained from the commercial strain gauge.

Figure 18A:
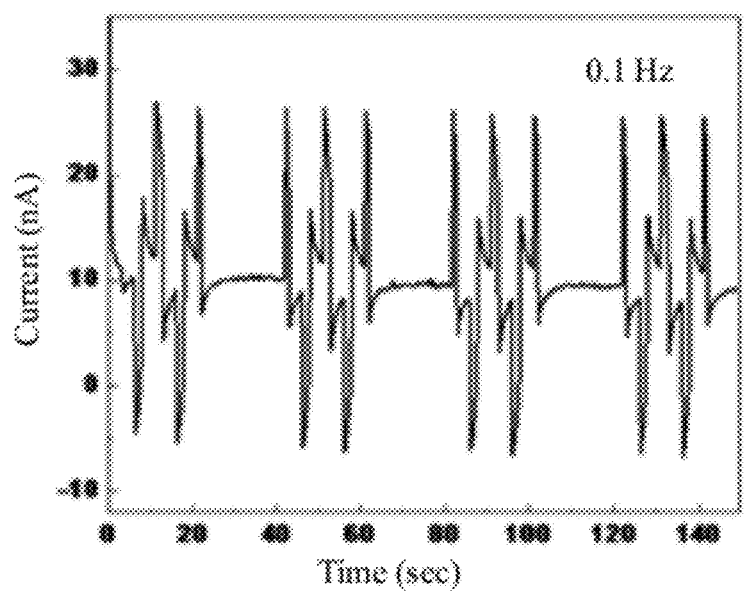
FIGS. 18A-18D depicts graphs that show the piezo-paper response on exciting the bean with range of frequency (0.1, 1, 2, and 4 Hz, respectively).
Figure 18B:
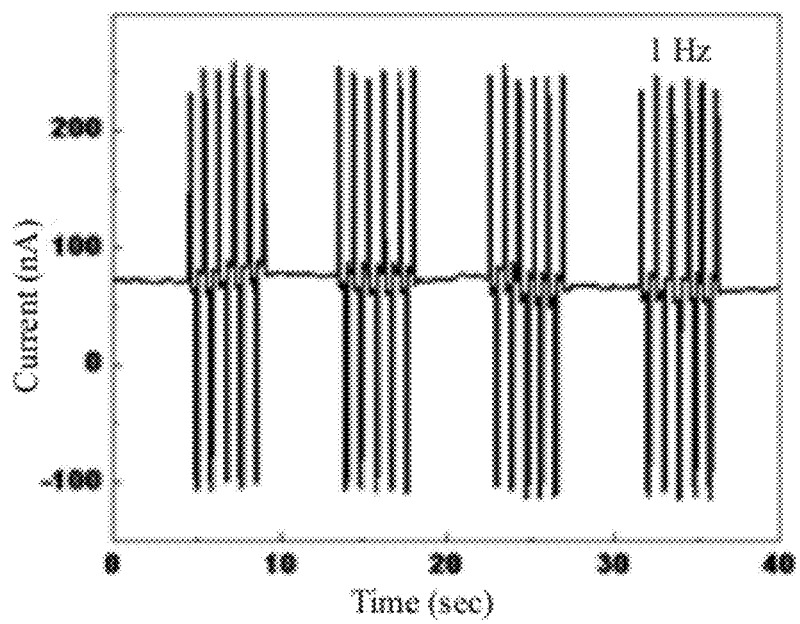
Figure 18C:
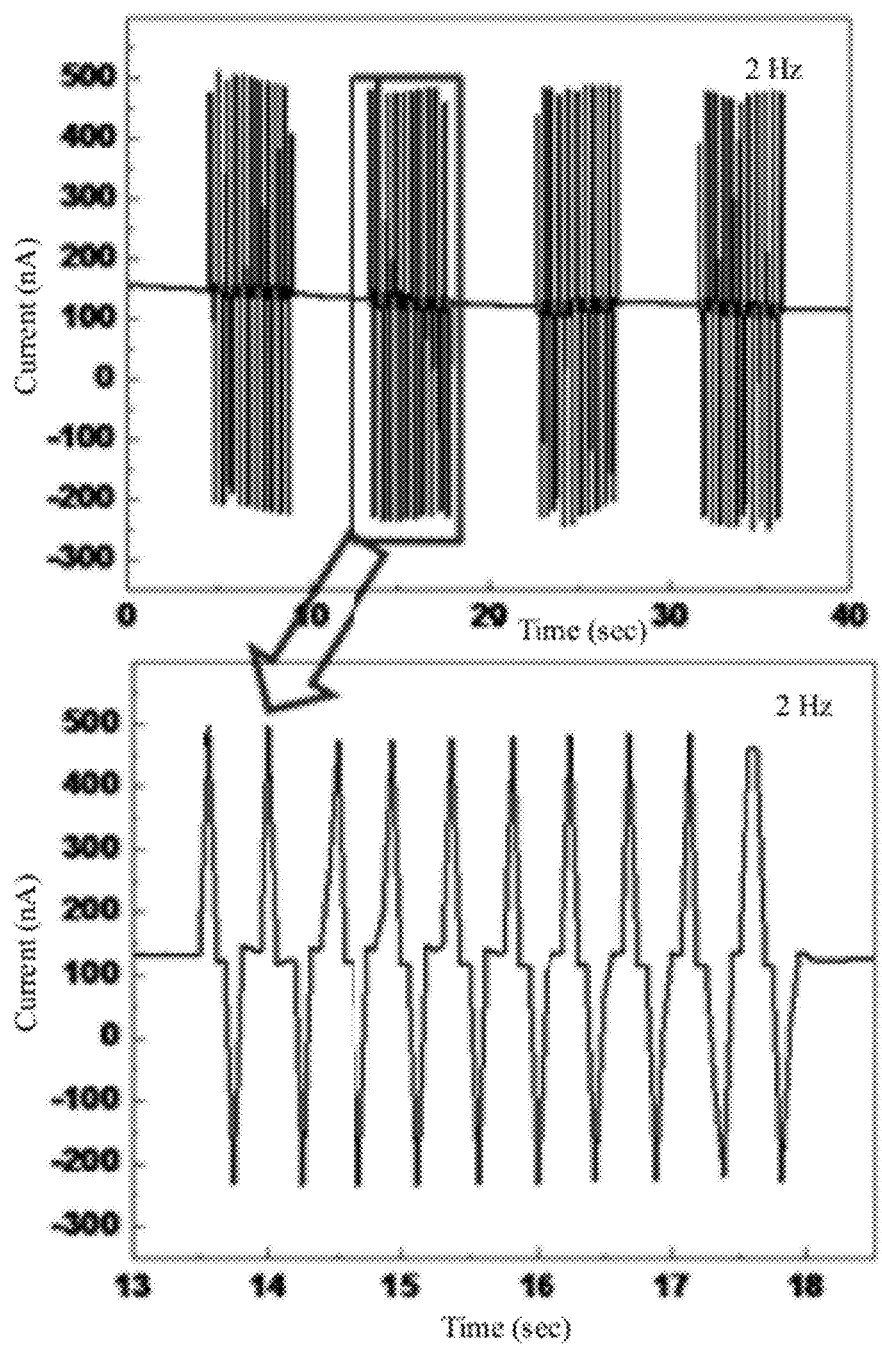
Figure 18D:
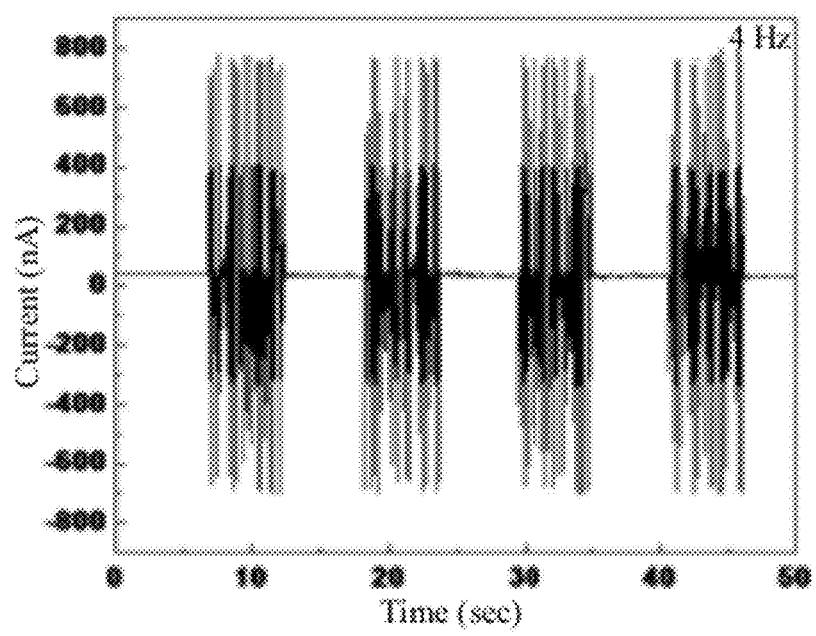

In order to show capability of measuring strain over a wide range of frequency bandwidth, the current response of the sensor device was measured at extremely low frequencies (0.1, 1, 2, and 4 Hz) as shown in FIGS. 18A-18D, respectively. The excitation was given in repeated sets of cycles of sinusoidal excitation the frequency of the response corresponds well with the frequency of excitation and a consistent behavior in the response of the sensor is observed for different frequencies. FIG. 18C includes a magnified view of the response and illustrates the reproducibility of the response under cyclic loading. Also, no drift was observed in the response at the end of each cycle of excitation.

It is observed that the response is in sync with the frequency with which the beam has been exited (FIG. 18). The current reached almost the same value in each cycle of straining, and the current can be fully recovered when the strain was relieved, indicating the sensor device had high reproducibility and good stability.

The composite based sensor shows good strain sensitivity for deformations in both tension and compression. Due to the piezoelectric nature of the composite, it can be operated without any source power as demonstrated in the dynamic loading tests, opening the possibility of self powered sensors.

Static Strain Measurement

Figure 19:
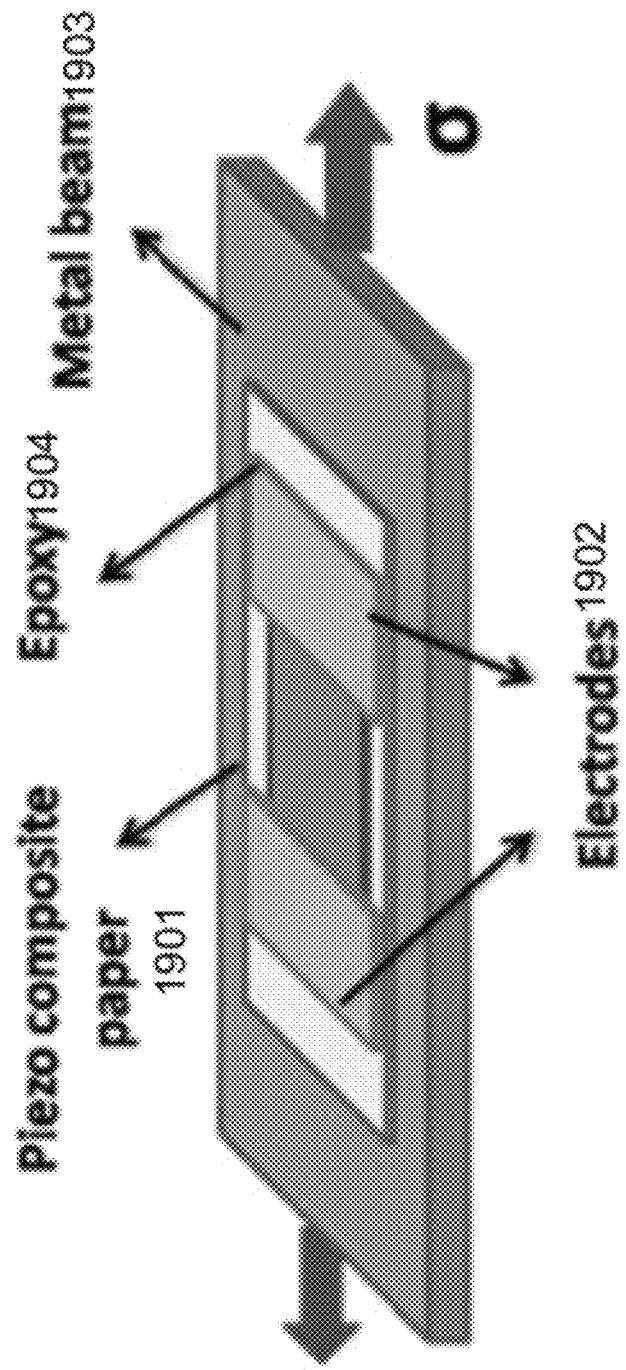
FIG. 19 is a schematic depicting the experimental setup for strain measurement under static loading.

The experimental configuration for strain sensor measurements under static loading is shown schematically in FIG. 19. For static strain sensing measurements, the specimen (with piezo paper 1901 and electrode 1902) was attached to a brass beam 1903 (cross sectional area 3.17 cm×0.635 cm with Young's Modulus of 166 GPa) using a thin coat of insulating epoxy 1904. A conventional, commercial grade foil strain gauge (Vishay Intertechnology Inc., PA, with a Gauge Factor of 2.1) was also attached onto the beam for comparison. Both the strain gauge and the composite sensor were oriented along the length of the beam. The brass beam 1903 was then mounted in a MTS hydraulic testing machine and an axial load applied to it along its length.

The performance of the composite sensor was evaluated by measuring its output current using a Keithley Series 2400 Digital Source Meter (with a sensitivity of 10 pA and a sampling rate of 100 samples per second) and compared with the strain measured using a commercial foil strain gauge. The measurements from the composite sensor was done using sheathed cables taking care to minimize the influence of surrounding noise on the measurements.

Figure 20:
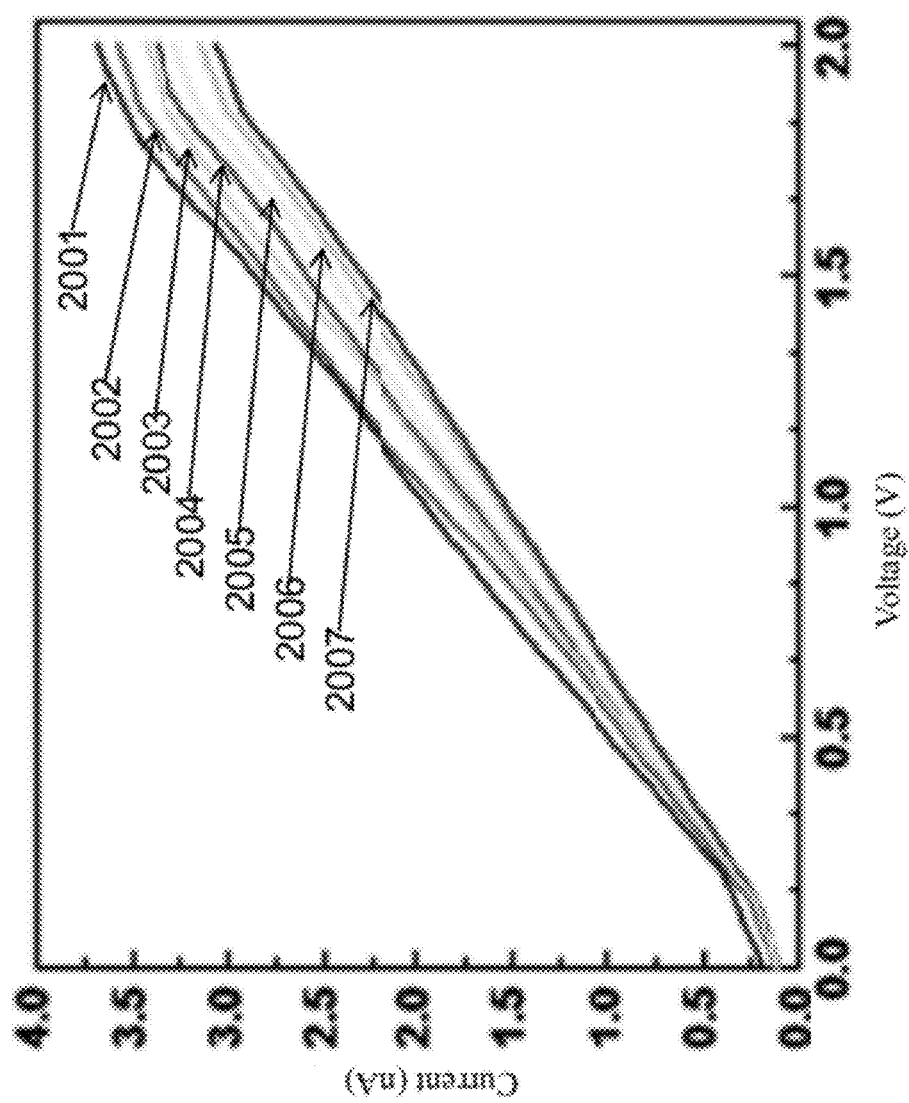
FIG. 20 depicts a graph that shows I-V characteristic of composite sensor as a function of strain.
Figure 21A:
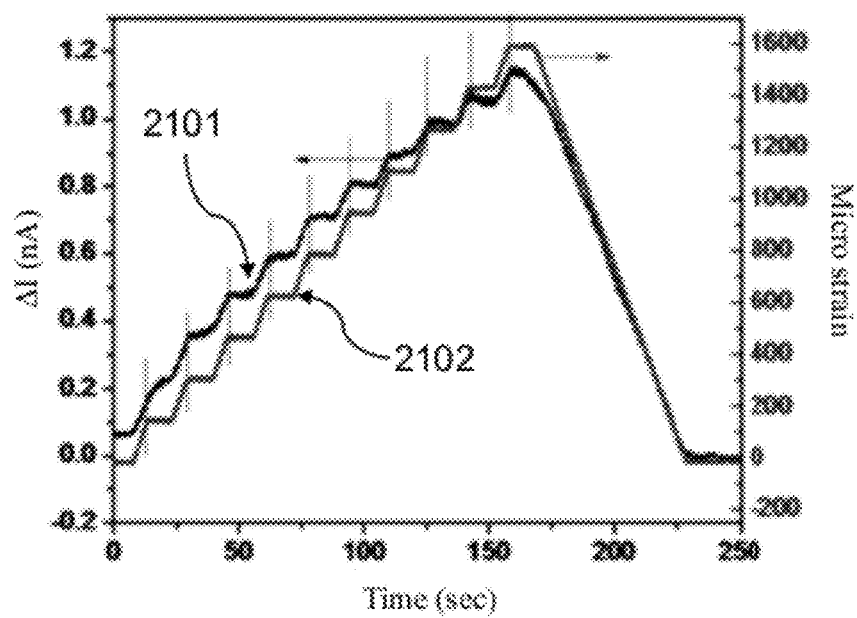
FIG. 21A depicts a graph that shows response of the composite sensor to stepped tensile loading.
Figure 21B:
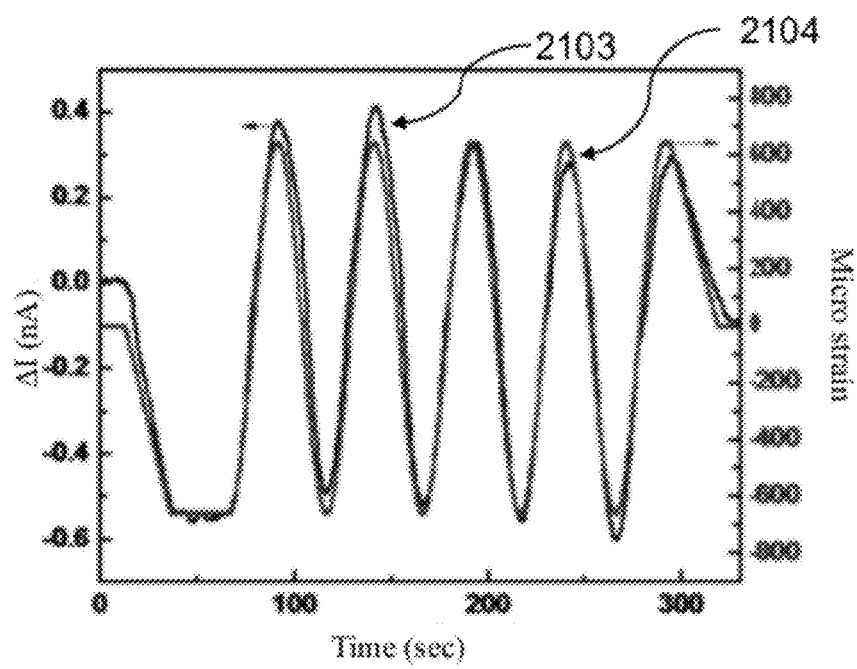
FIG. 21B depicts a graph that shows response of the composite sensor to combined compressive and tensile cyclic loading.

As shown in FIG. 20, the I-V characteristic curves of the composite sensor at different strains (0.01%, 0.02%, 0.04%, 0.05%, 0.06%, 0.08% and 0.10% as indicated in curves 2101-2107, respectively) indicate an upward shift with increasing tension. FIG. 21A shows the current response from the composite sensor (curve 2101) and the strain reading from the commercial strain gauge (curve 2102) for a stepped tensile loading. The composite sensor was tested under cyclic loading in both compression and tension shown in FIG. 21B (with current response and strain reading depicted in curves 2103 and 2104, respectively). The loading was done at a very low rate and hence no dynamic effects of the brass beam are observed in the response. A voltage bias of 0.1V was applied for the results presented in FIGS. 21A-21B. The response from the composite sensor was found to be in good agreement with the strain measured from foil strain gauge for static loading. The composite sensor behaves in a similar manner in both compression and tension for cyclic loading (FIG. 21B) and even after repeated cycles no drift was observed in the response. The signal to noise ratio is also very high for the response observed. Gauge Factor of the composite sensor can be calculated using the modified formula [from Sabnis, G. M., et al., Structural Modeling and Experimental Techniques (1999)] as follows:

$$GF = \frac{\frac{\Delta R}{R}}{\varepsilon} = \frac{\frac{\Delta i}{i_f}}{\varepsilon} = \frac{(i_0 - i_f)}{i_f \times \varepsilon},$$

where, $\varepsilon$ is the strain applied to the sensor, $i_0$ is the initial current at zero strain, and $i_f$ is the final current at $\varepsilon$ strain. From the observed results, the gauge factor of the composite sensor (21.1176) was found to be approximately 10 times higher than the generally recorded values for commercially available metallic foil strain gauges (approximately 2). The composite based sensor showed good strain sensitivity for deformations in both tension and compression Further Uses Applicant has presented a technique to embed piezo electric ZnO in to a commercial paper, using a simple and scalable synthesis method. Since ZnO is a well known material for piezoelectric applications, it has wide range of applications like acoustic sensing [M. Royer, et al., ZnO on Si integrated acoustic sensor, *Sensors and Actuators,* 4, 357 (1983)] and energy harvesting [Wang 2006]. By making a continuous coating of this on a flexible matrix such as paper through controlled engineering at the nanoscale, flexibility can be introduced without losing the performance of the piezoelectric material. The composite sensor can be molded into sensor devices, showing characteristics of good sensitivity and linearity at different frequencies. The mechanically robust nature of the sensor also makes it amenable for field applications such as structural health monitoring (SHM). It has potential applications of low-frequency vibration measurement, self powered sensors and SHM.

The scalability of the device has also been shown by stacking these in parallel, which scales the performance to higher values. The present invention also opens up new fabrication approaches for the realization of low cost flexible energy generators and sensors that could power devices from the nanoscale to the macroscale.

It is believed that in certain, embodiments of the present invention, performance can be improved by using difference piezoelectric materials or by doping the composite with other materials.

It is further believe that, in certain embodiments, low power generation can be utilized.

Possible variations of the present invention further include the use of any flexible polymer as substrates including conductive polymers for the energy harvesting composite and insulating polymers for the supercapacitor. Other nanostructured piezoelectric material could be used for the energy harvesting composite, and any other conductive flexible nanostructured material could be used for the storage composite.

While embodiments of the invention have been shown and described, modifications thereof can be made by one skilled in the art without departing from the spirit and teachings of the invention. The embodiments described and the examples provided herein are exemplary only, and are not intended to be limiting. Many variations and modifications of the invention disclosed herein are possible and are within the scope of the invention. Accordingly, the scope of protection is not limited by the description set out above, but is only limited by the claims which follow, that scope including all equivalents of the subject matter of the claims.

The disclosures of all patents, patent applications, and publications cited herein are hereby incorporated herein by reference in their entirety, to the extent that they provide exemplary, procedural, or other details supplementary to those set forth herein.

What is claimed is:

1. A composite material comprising:
   (a) a flexible polymer; and
   (b) a nanostructured piezoelectric material embedded in the flexible polymer, wherein the nanostructured piezoelectric material coats the flexible polymer, and wherein the composite material is flexible.

2. The composite material of claim 1, wherein the composite is operable for a use selected from the group consisting of harvesting electrical energy from mechanical energy, harvesting electrical energy from thermal energy, storing harvested energy, sensing strain, and combinations thereof.

3. The composite material of claim 1, wherein the flexible polymer is a polymer selected from the group consisting of cellulose, paper, and combinations thereof.

4. The composite material of claim 1, wherein the flexible polymer is porous.

5. The composite material of claim 1, wherein the nanostructured piezoelectric material comprises a material selected from the group consisting of zinc oxide, lead titanate, barius titanate, and combinations thereof.

6. The composite material of claim 1, wherein the nanostructured piezoelectric material comprises zinc oxide.

7. The composite material of claim 1, wherein the nanostructured piezoelectric material comprises at least about 50 weight percent of the composite material.

8. The composite material of claim 1, wherein the nanostructure piezoelectric material comprises nanorods.

9. The composite material of claim 8, wherein the nanorods have an average diameter between about 40 nm to about 100 nm and the nanorods have an average length between about 500 nm to about 1000 nm.

10. An apparatus comprising a composite material comprising a porous polymer embedded and coated with a nanostructured piezoelectric material, wherein the apparatus is operable for use selected from the group consisting of harvesting electrical energy from mechanical energy, harvesting electrical energy from thermal energy, storing harvested energy, sensing strain, and combinations thereof.

11. The apparatus of claim 10, wherein the composite material is operable for use as an energy harvesting material in the apparatus.

12. The apparatus of claim 11 further comprising:
   (a) a storage comprising an array of conductive one-dimensional nanostructures embedded in a polymer matrix including an electrolyte; and
   (b) interconnects and electrodes operatively connected to the energy harvesting material and the storage.

13. The apparatus of claim 10, wherein the composite material is flexible.

14. The apparatus of claim 10, wherein
   (a) the apparatus comprises a plurality of devices,
   (b) a first device of the plurality of devices comprises the composite material,
   (c) a second device of the plurality of devices a second composite material comprising a second porous polymer embedded and coated with a nanostructured piezoelectric material;
   (d) the plurality of devices are operatively connected; and
   (e) at least some of the plurality of devices are connected in series or parallel.

15. The apparatus of claim 14, wherein the composite material and the second composite material are the same type.

16. The apparatus of claim 14, wherein the composite material and the second composite material are different type.

17. The apparatus of claim 14, wherein the plurality of devices comprise at least ten devices that are connected in series or parallel.

* * * * *

UNITED STATES PATENT AND TRADEMARK OFFICE
Certificate

Patent No. 8,310,134 B2                                                            Patented: November 13, 2012

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Pulickel M. Ajayan, Houston, TX (US); Ashavani Kumar, Honolulu, HI (US); Andres Rafael Botello-Mendez, San Luis Potosi (MX); Hemtej Gullapalli, Houston, TX (US); Mauricio Terrones Maldonado, Colonia Lomas (MX); and Humberto Terrones, State College, PA (US).

Signed and Sealed this Sixth Day of May 2014.

*SHAWKI ISMAIL*
*Supervisory Patent Examiner*
*Art Unit 2837*
*Technology Center 2800*